(12) United States Patent
Tanaka

(10) Patent No.: US 6,852,947 B2
(45) Date of Patent: Feb. 8, 2005

(54) LASER IRRADIATION APPARATUS, LASER IRRADIATION METHOD, AND METHOD OF MANUFACTURING A SEMICONDUCTOR DEVICE

(75) Inventor: Koichiro Tanaka, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 223 days.

(21) Appl. No.: 10/290,383

(22) Filed: Nov. 8, 2002

(65) Prior Publication Data

US 2003/0089691 A1 May 15, 2003

(30) Foreign Application Priority Data

Nov. 9, 2001 (JP) ........................................ 2001-345169
Nov. 16, 2001 (JP) ........................................ 2001-350889

(51) Int. Cl.$^7$ ............................................. B23K 26/00
(52) U.S. Cl. ............................ 219/121.76; 219/121.85
(58) Field of Search ..................... 219/121.76, 121.85, 219/121.6

(56) References Cited

U.S. PATENT DOCUMENTS

| | | | |
|---|---|---|---|
| 4,330,363 A | | 5/1982 | Biegesen et al. |
| 4,370,175 A | | 1/1983 | Levatter |
| 4,668,089 A | | 5/1987 | Oshida et al. |
| 5,558,788 A | * | 9/1996 | Mashburn ............... 219/121.68 |
| 5,643,826 A | | 7/1997 | Ohtani et al. |
| 5,803,965 A | | 9/1998 | Yoon |
| 5,854,803 A | | 12/1998 | Yamazaki et al. |
| 5,869,803 A | * | 2/1999 | Noguchi et al. ....... 219/121.62 |
| 5,886,320 A | | 3/1999 | Gallo et al. |
| 5,923,962 A | | 7/1999 | Ohtani et al. |
| 5,953,597 A | | 9/1999 | Kusumoto et al. |
| 6,043,453 A | | 3/2000 | Arai |
| 6,204,099 B1 | | 3/2001 | Kusumoto et al. |
| 6,210,996 B1 | | 4/2001 | Yamazaki et al. |
| 6,265,745 B1 | | 7/2001 | Kusumoto et al. |
| 6,285,042 B1 | | 9/2001 | Ohtani et al. |
| 6,335,541 B1 | | 1/2002 | Ohtani et al. |
| 6,365,933 B1 | | 4/2002 | Yamazaki et al. |
| 6,396,616 B1 | | 5/2002 | Fitzer et al. |
| 6,567,219 B1 | * | 5/2003 | Tanaka ...................... 359/624 |
| 6,573,162 B2 | * | 6/2003 | Tanaka et al. .............. 438/487 |
| 6,590,230 B1 | | 7/2003 | Yamazaki et al. |
| 6,650,480 B2 | * | 11/2003 | Tanaka ...................... 359/618 |
| 6,700,096 B2 | | 3/2004 | Yamazaki et al. |
| 2001/0019861 A1 | | 9/2001 | Yamazaki et al. |
| 2002/0094008 A1 | | 7/2002 | Tanaka |
| 2002/0100937 A1 | | 8/2002 | Yamazaki et al. |
| 2003/0112322 A1 | | 6/2003 | Tanaka |

OTHER PUBLICATIONS

U.S. Appl. No. 10/279,960 filed Oct. 25, 2002 is being submitted as related information for the above application being filed.

* cited by examiner

Primary Examiner—M. Alexandra Elve
(74) Attorney, Agent, or Firm—Nixon Peabody LLP; Jeffrey L. Costellia

(57) ABSTRACT

At edges of laser light on an irradiation surface or in the vicinity thereof, the energy density is attenuated gradually due to aberration of a lens or the like. Since such regions (attenuation regions) do not have enough energy density for annealing of an irradiation object, uniform annealing of the irradiation object is not possible.

In the present invention, one of the plural laser beams is divided into two laser beams so that each section of the two laser beams serves as an edge of the resultant laser light. Each attenuation region of the two laser beams is synthesized with an attenuation region of another laser beam. In this way, laser light every part of which has an energy density suitable for satisfactory annealing of an irradiation object can be obtained from plural laser beams having attenuation regions.

44 Claims, 17 Drawing Sheets

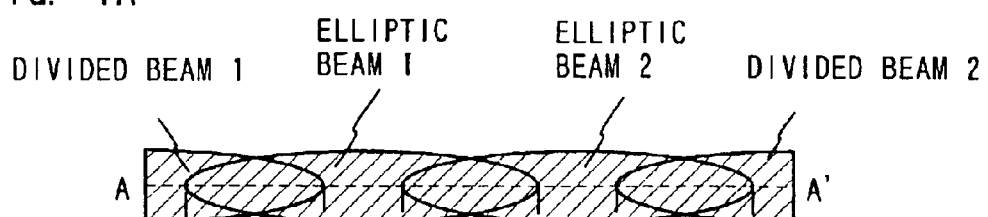
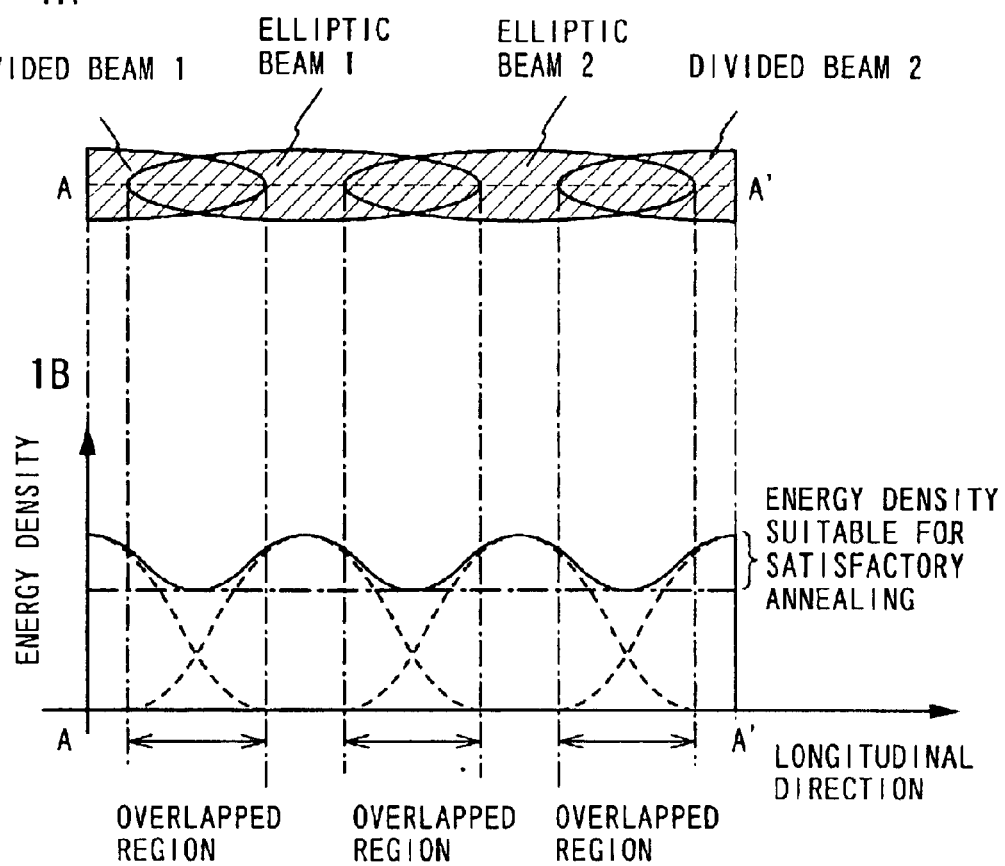

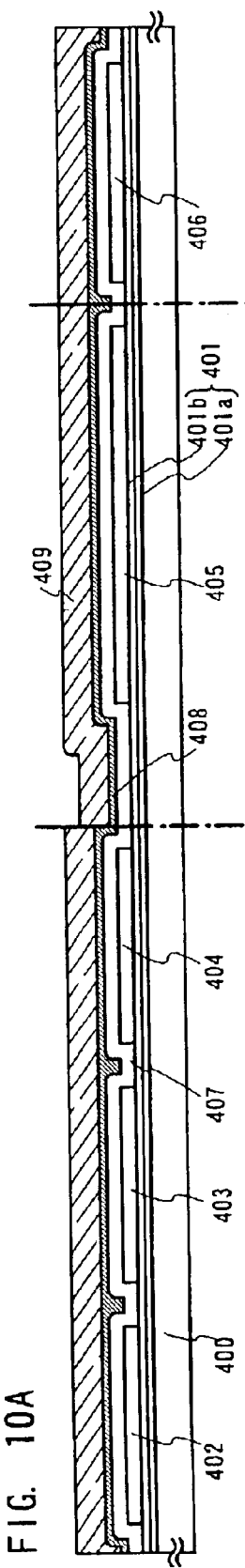
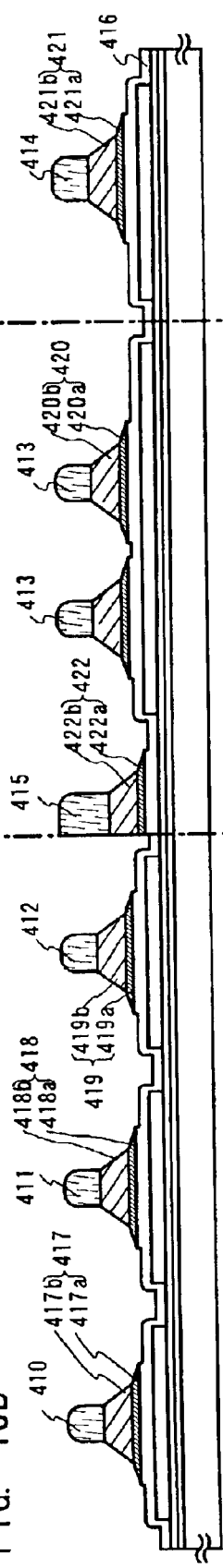
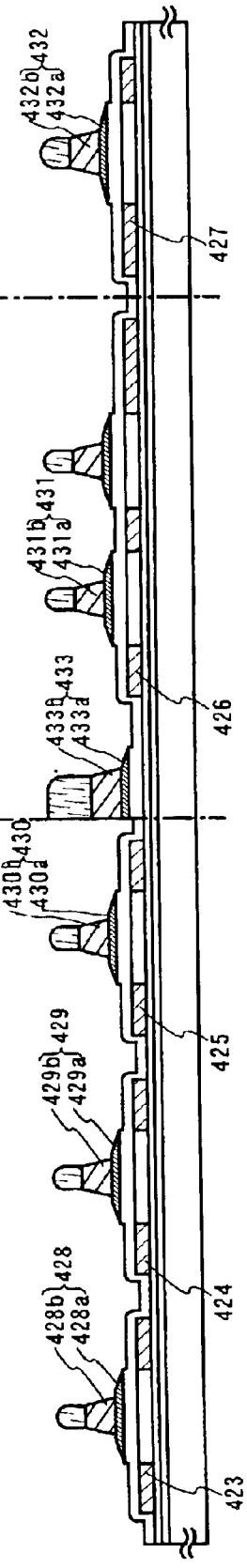
FIG. 10A
FIG. 10B
FIG. 10C

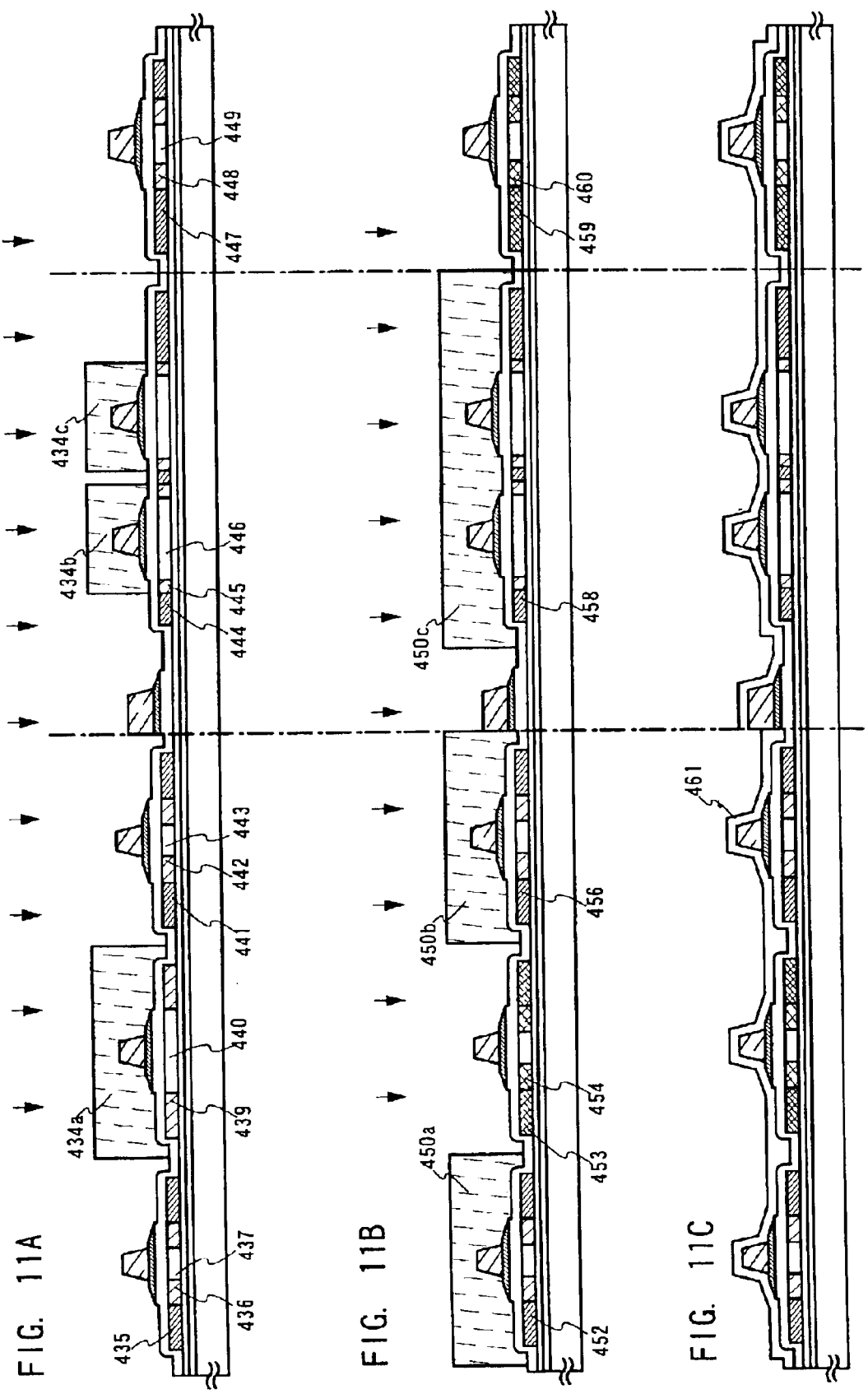

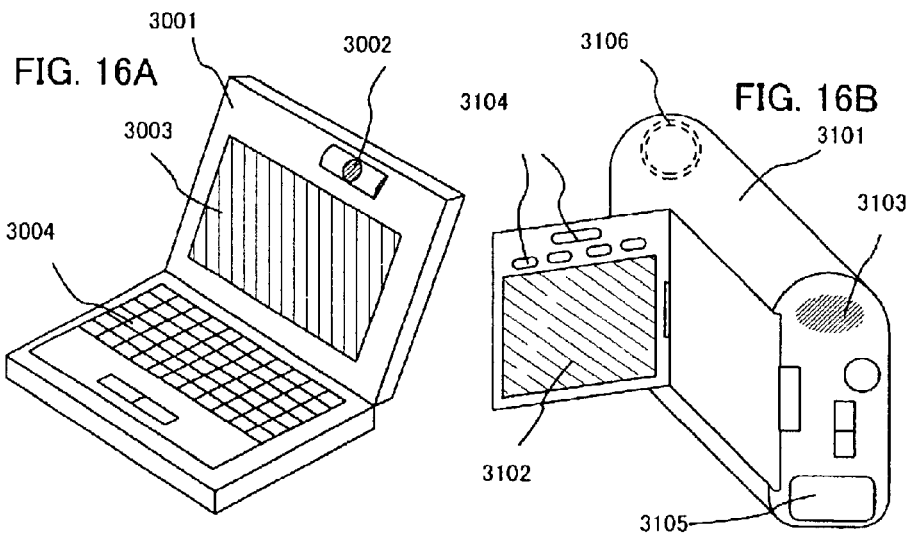
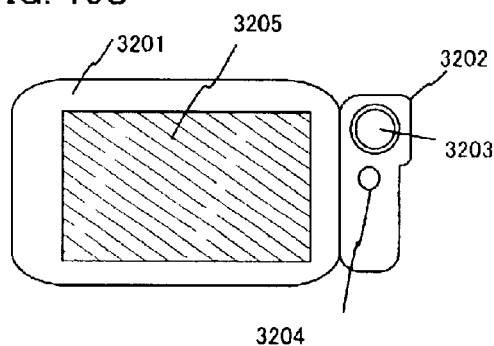
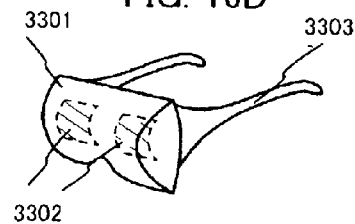
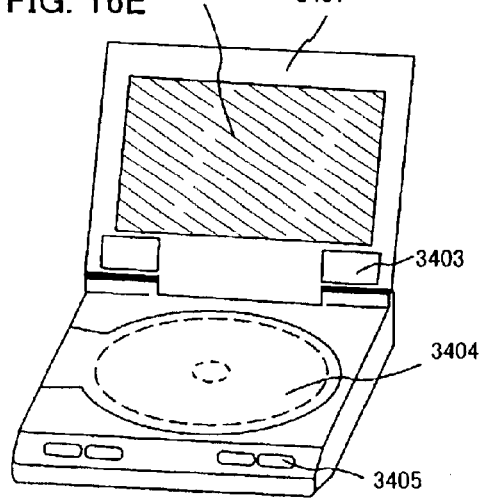
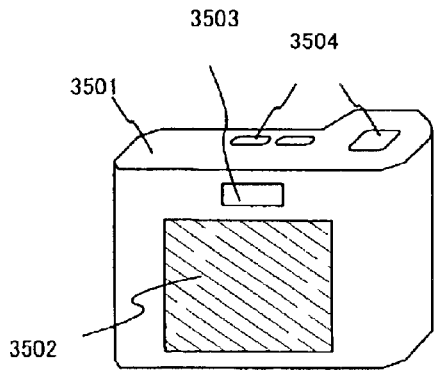

LASER IRRADIATION APPARATUS, LASER IRRADIATION METHOD, AND METHOD OF MANUFACTURING A SEMICONDUCTOR DEVICE

BACKGROUND OF THE INVENTION

1. Field of the Invention

The present invention relates to a method of annealing a semiconductor film using a laser light (hereinafter referred to as laser annealing) and to a laser irradiation apparatus for conducting the method (apparatus including a laser and an optical system for guiding a laser light emitted from the laser to an object to be processed). Also, the present invention relates to a method of manufacturing a semiconductor device including said step of laser annealing. Note that the term semiconductor device mentioned here indicates semiconductor devices in general which can function by utilizing semiconductor characteristics, and includes electro-optical devices such as a liquid crystal display device, a light emitting device and an electronic device including the electro-optical device as a component.

2. Description of the Related Art

In recent years, there has been widely studied a technique of conducting laser annealing to a semiconductor film formed on an insulating substrate made of glass or the like to crystallize the film, thereby improving crystallinity. Silicon is often used for the semiconductor film. In this specification, a method of crystallizing a semiconductor film with a laser light to obtain a crystalline semiconductor film is referred to as laser crystallization.

A glass substrate has such advantages that: it is inexpensive and has a wealth of processability; and a large-area substrate can be easily manufactured from the glass substrate in comparison with a synthetic quartz glass substrate often used in the prior art. This is the reason why the above study is being made. Further, the reason a laser is used for crystallization from choice residues in that the glass substrate has a low melting point. The laser can impart high energy only to a semiconductor film without increasing temperature much in substrate. Further, crystallization can be performed with the laser in a short time. Thus, remarkably high throughput is provided with the laser in comparison with a heating means using an electrically-heated oven.

The crystalline semiconductor film formed by performing laser irradiation has high mobility, and thus is actively used for an active matrix liquid crystal display device, for example, which is manufactured by forming thin film transistors (TFTs) using the crystalline semiconductor film and forming TFTs for a pixel portion and for a driver circuit on, for example, a glass substrate.

A laser beam oscillated from an Ar laser and an excimer laser or the like is often used as the laser beams. A method of using the Ar laser to perform laser crystallization is disclosed in Japanese Patent Laid-Open No. 6-163401 and Japanese Patent Laid-Open No. 7-326769, etc. The excimer laser has advantages that the excimer laser can be highly outputted and irradiated repetitively at a high frequency. Further, laser beams emitted from the excimer laser has the advantages of having a high absorption coefficient with respect to silicon films, which is often used as a semiconductor film.

As to the laser irradiation, a method of the laser irradiation in which the laser beam is formed by an optical system such that it becomes a elliptical shape, a rectangular shape and a linear shape on an irradiation surface and the periphery thereof, and the laser beam is shifted (or relatively shifting an irradiation position of the laser beam with respect to the irradiation surface) is superior in mass productivity and is excellent in technology. The "linear shape" described here means not a "line" in the strict sense but a rectangle (or a prolate ellipsoid shape) having a high aspect ratio. For example, it indicates a shape having an aspect ratio of 10 or more (preferably, 100 to 10,000). In this specification, a laser beam shape (laser beam spot) on the irradiation surface, an ellipsoid shape is referred to as an ellipsoid beam; a rectangular shape, a rectangular shape beam; a linear shape, a linear beam. If there is no definition for the laser beam spot particularly, it means a cross-section by a perpendicular plane with respect to the optical axis.

At an edge of elliptical shape, rectangular, or linear laser light formed on an irradiation surface or in the vicinity thereof by an optical system, the energy density in central part reaches a peak while in the edge part thereof is attenuated gradually due to aberration of a lens or the like (FIGS. 9A and 9B). In such a laser light, in order to perform annealing on an object to be irradiated, a region with enough energy density is around $\frac{1}{5}$ to $\frac{1}{3}$ of the entire irradiation surface including the central part of the laser light and is extremely narrow. In this specification, a region at edges of the laser light where the energy density is insufficient to perform annealing on an object to be irradiated is called an attenuation region.

As the substrate area is increased and the laser power is raised, it is now possible to form a longer elliptical shape beam, linear beam and rectangular beam. Annealing with such laser light is more efficient. However, the energy density of laser light emitted from a laser is smaller at its edge than around the center. Therefore, if laser light is expanded by an optical system more than prior art, attenuation in the attenuation region is intensified.

In comparison with the central part of the laser light, the energy density in the attenuation regions is not enough, for this reason, an object to be irradiated cannot be annealed sufficiently by using the laser light having the attenuation regions.

For example, when a semiconductor film is an irradiation object, a region of the semiconductor film that is annealed by the attenuation region and a region of the semiconductor film that is annealed by the highly uniform region including the central part have different crystallinity. Therefore, if this semiconductor film is used to manufacture TFTs, the electric characteristic of a TFT formed from the region that is annealed by the attenuation region is inferior to other TFTs and causes fluctuation among the TFTs on the same substrate.

SUMMARY OF THE INVENTION

The present invention has been made in view of the above, and an object of the present invention is therefore to provide laser irradiation apparatus in which uniform annealing can be performed efficiently by using a laser light having attenuation region. Another object of the present invention is to provide a laser irradiation method using this laser irradiation apparatus as well as a method of manufacturing a semiconductor device that includes the laser irradiation method in its process.

In the present invention, attenuation regions of plural laser beams are synthesized on an irradiation surface or in the vicinity thereof. However, the thus obtained laser light has attenuation regions at its edges. Therefore one of the plural laser beams is divided into a divided beam 1 having an attenuation region and a divided beam 2 having an attenuation region. The attenuation region of the divided beam 1 is synthesized with an attenuation region of another laser beam and the attenuation region of the divided beam 2 is synthesized with an attenuation region of still another laser beam so that the section of the divided beam 1 serves as one edge of the resultant laser light and the section of the divided beam 2 serves as the other edge (FIG. 1A). Thus, laser light every part of which has an energy density suitable for satisfactory annealing of an irradiation object can be obtained from plural laser beams having attenuation regions (FIG. 1B).

The energy density of laser light on an irradiation surface does not always peak at the center of the laser light while it is gradually attenuated at the edges. Laser light may have plural energy peaks depending on the laser mode. The present invention can be applied to any laser mode as long as laser light has an attenuation region where the energy density is not enough for annealing of an irradiation object.

A structure of the present invention disclosed in this specification is laser irradiation apparatus characterized by including: a plurality of lasers; means for. choosing one laser beam out of plural laser beams that are emitted from the plural lasers and dividing the laser beam by a perpendicular plane to the direction the laser light travels into two laser beams, the two laser beams each having the section resulting from the division as one edge and an attenuation region as the other edge; and an optical system for synthesizing the attenuation regions of the two laser beams with attenuation regions of other laser beams so that the sections of the two laser beams serve as the left and right edges of the resultant laser light.

In the above-mentioned structure, the foregoing laser can be a solid state laser, a gas laser, or a metal laser of continuous oscillation or pulse oscillation. It should be noted that as the foregoing solid state laser, YAG laser, $YVO_4$ laser, YLF laser, $YAlO_3$ laser, $Y_2O_3$ laser, glass laser, ruby laser, alexandrite laser, Ti: sapphire laser or the like of continuous oscillation or pulse oscillation are listed, as the foregoing gas laser, excimer laser, Ar laser, Kr laser, $CO_2$ laser or the like of continuous oscillation or pulse oscillation are listed, and as the foregoing metal laser, helium-cadmium laser, copper vapor laser, gold vapor laser and the like are listed.

Moreover, in the respective configurations described above, it is desirable that the foregoing laser beam has been converted into a higher harmonic wave by a non-linear optical element. For example, it is known that a YAG laser emits a laser beam in the wavelength of 1065 nm as a fundamental wave. The absorption coefficient of this laser beam with respect to the silicon film is very low, so it is difficult from the technical viewpoint to crystallize an amorphous silicon film, which is one of semiconductor films if it remains as it is. However, this laser beam can be converted into a shorter wavelength using a nonlinear optical element, and as a higher harmonic wave, the second higher harmonic wave (532 nm), the third higher harmonic wave (355 nm), the fourth higher harmonic wave (266 nm) and the fifth harmonic wave (213 nm) are listed. Since these higher harmonic waves have high absorption coefficients with respect to the amorphous silicon film, these can be utilized for crystallization of the amorphous silicon film.

A structure of the present invention disclosed in this specification is a laser irradiation method characterized by including: choosing one laser beam out of plural laser beams that are emitted from the plural lasers and dividing the laser beam by a perpendicular plane to the direction the laser light travels into two laser beams, in the object to be irradiated and in the vicinity thereof, the two laser beams each having the section resulting from the division as one edge and an attenuation region as the other edge, and synthesizing the attenuation regions of the two laser beams with attenuation regions of other laser beams so that the sections of the two laser beams serve as the left and right edges of the resultant laser light, forming the laser light, and the resultant laser light is being relatively shifted, thereby irradiating the object to be irradiated.

In the above-mentioned structure, the foregoing laser can be a solid state laser, a gas laser, or a metal laser of continuous oscillation or pulse oscillation. It should be noted that as the foregoing solid state laser, YAG laser, $YVO_4$ laser, YLF laser, $YAlO_3$ laser, glass laser, ruby laser, alexandrite laser, Ti: sapphire laser or the like of continuous oscillation or pulse oscillation are listed, as the foregoing gas laser, excimer laser, Ar laser, Kr laser, $CO_2$ laser or the like of continuous oscillation or pulse oscillation are listed, and as the foregoing metal laser, helium-cadmium laser, copper vapor laser, gold vapor laser and the like are listed.

In addition, in the above-described structure, it is desirable that the laser light is being converted into harmonics by non-linear optical elements.

A structure of the present invention disclosed in the specification is a manufacturing method of a semiconductor device characterized by including: choosing one laser beam out of plural laser beams that are emitted from the plural lasers and dividing the laser beam by a perpendicular plane to the direction the laser light travels into two laser beams, in the object to be irradiated and in the vicinity thereof, the two laser beams each having the section resulting from the division as one edge and an attenuation region as the other edge, and synthesizing the attenuation regions of the two laser beams with attenuation regions of other laser beams so that the sections of the two laser beams serve as the left and right edges of the resultant laser light, forming the laser light, and the resultant laser light is being relatively shifted, thereby irradiating the semiconductor film, and performing the crystallization and the improvement of crystallinity of the semiconductor film.

Furthermore, a structure of other inventions disclosed in this is a manufacturing method of a semiconductor characterized by including: choosing one laser beam out of plural laser beams that are emitted from the plural lasers and dividing the laser beam by a perpendicular plane to the direction the laser light travels into two laser beams, in the object to be irradiated and in the vicinity thereof, the two laser beams each having the section resulting from the division as one edge and an attenuation region as the other edge, and synthesizing the attenuation regions of the two laser beams with attenuation regions of other laser beams so that the sections of the two laser beams serve as the left and right edges of the resultant laser light, forming the laser light, and the resultant laser light is being relatively shifted and irradiating the semiconductor film in which impurity elements are introduced, thereby performing the activation of the impurity elements.

In the above-mentioned structure, the foregoing laser can be a solid state laser, a gas laser, or a metal laser of continuous oscillation or pulse oscillation. It should be noted that as the foregoing solid state laser, YAG laser, $YVO_4$ laser, YLF laser, $YAlO_3$ laser, $Y_2O_3$ laser, glass laser, ruby laser, alexandrite laser, Ti: sapphire laser or the like of continuous oscillation or pulse oscillation are listed, as the foregoing gas laser, excimer laser, Ar laser, Kr laser, $CO_2$ laser or the like of continuous oscillation or pulse oscillation are listed, and as the foregoing metal laser, helium-cadmium laser, copper vapor laser, gold vapor laser and the like are listed.

In addition, in the above-described structure, it is desirable that the laser light is being converted into harmonics by non-linear optical system elements.

Moreover, in the configurations described above, it is preferable to use a film containing silicon for the foregoing semiconductor film. For the foregoing substrate forming the semiconductor film, a glass substrate, a quartz substrate, a silicon substrate, a plastic substrate, a metal substrate, a stainless clad substrate, a flexible substrate and the like can be utilized. As the foregoing glass substrate, a substrate consisted of glass such as barium borosilicate glass, aluminum borosilicate glass or the like can be listed. Moreover, a flexible substrate is referred to a substrate in a film shape consisted of PET, PES, PEN, acryl or the like, if a semiconductor device is prepared by utilizing the flexible substrate, the weight lightening of it is expected. If on the surface or on the surface and the back surface of the flexible substrate, a barrier layer made of aluminum film (AlON, AlN, AlO or the like), carbon film (DLC (diamond like carbon) or the like), SiN or the like is formed in a monolayer or multilayer, it is desirable that the durability or the like is enhanced.

In the present invention, laser light very excellent in uniformity of energy distribution can be formed on an irradiation surface or in the vicinity thereof by using the plural laser lights having the attenuation regions. And accordingly, an object to be irradiated can be annealed uniformly by using such kind of laser light. Moreover, since the attenuation regions where energy density has being insufficient for performing annealing up to now is utilized effectively, throughput can be enhanced. Further, since a semiconductor film formed on the substrate can be irradiated effectively and uniformly, the crystallization and crystallinity of the semiconductor film can be improved, and the activation of the impurity elements can be performed well. Furthermore, the dispersion of electric properties of the obtained TFT by using such a semiconductor film can be reduced, thereby good electric properties obtaining. Moreover, a semiconductor device manufactured by such TFTs, operation properties and reliabilities thereof can be improved.

BRIEF DESCRIPTION OF THE DRAWINGS

FIGS. 1A and 1B show an example of a laser beam on the irradiated surface and the energy density disclosed in the present invention;

FIGS. 10A to 10C are cross-sectional views showing the steps of manufacturing pixel TFTs and TFTs for driver circuits;

FIGS. 11A to 11C are cross-sectional views showing the steps of manufacturing pixel TFTs and TFTs for driver circuits;

FIGS. 16A to 16F are examples of the semiconductor device;

DETAILED DESCRIPTION OF THE PREFERRED EMBODIMENTS

Figure 2:
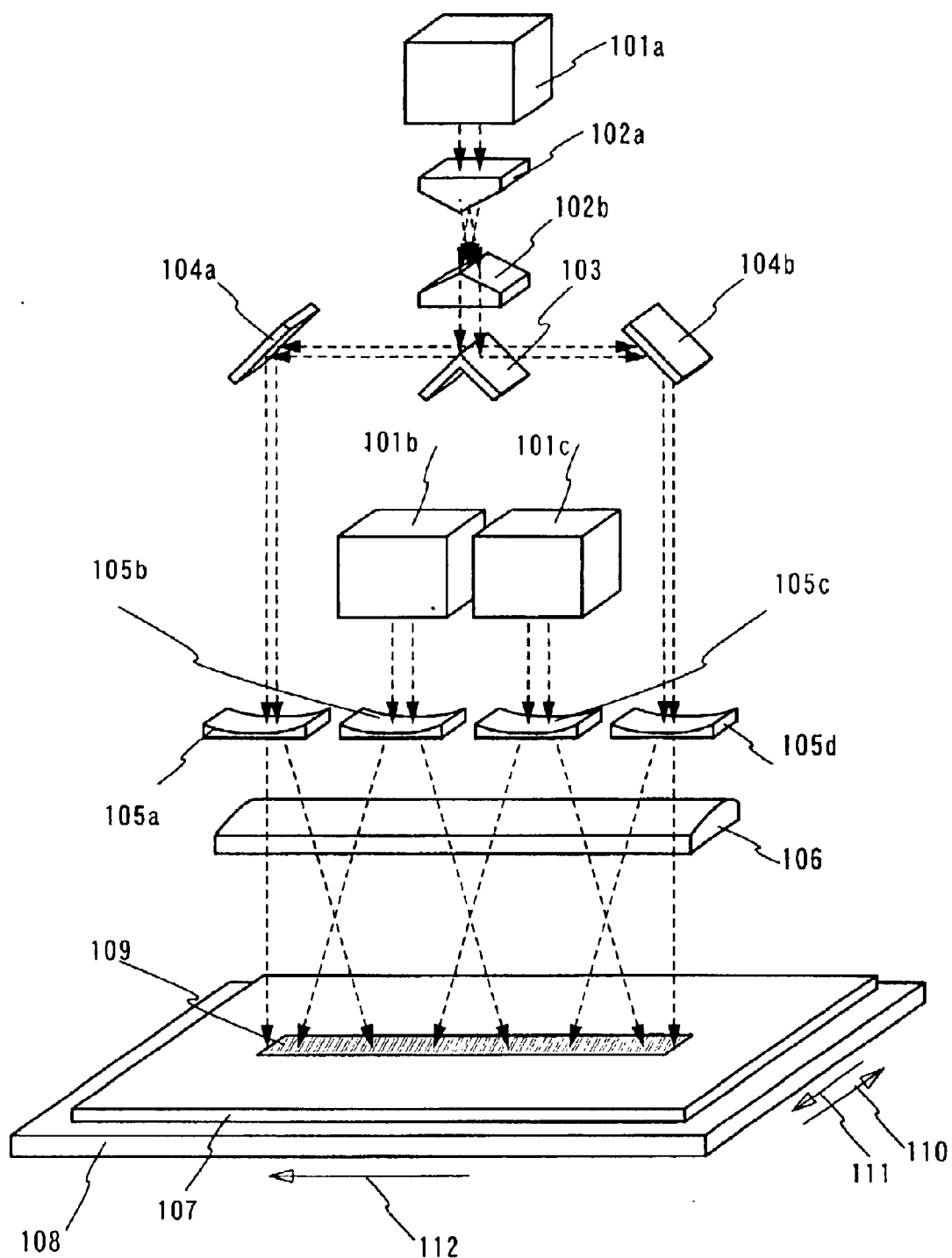
FIG. 2 is a diagram showing an example of a laser irradiation device disclosed in the present invention.

An embodiment mode of the present invention is described with reference to FIG. 2.

Laser beams emitted from lasers 101b and 101c are widened and expanded in the longitudinal direction by concave cylindrical lenses 105b and 105c, respectively. Though not shown in the drawing, beam collimators for changing the laser beams emitted from the lasers 101b and 101c into parallel beams and beam expanders for expanding laser light may be placed between the lasers 101b and 101c and the concave cylindrical lenses 105b and 105c. The laser beams reach a substrate 107 after they are focused and collected in the lateral direction by a convex cylindrical lens 106 that has curvature in the lateral direction.

On the other hand, laser light emitted from a laser 101a is divided by a prism 102a into two to change the direction the light travels. The laser beams enter and exit a prism 102b so that the left half and right half (length-wise, with the high-energy density area as the border) of the initial laser light are switched. This is for forming, on the substrate 107, laser light 109 every part of which has enough energy density. By switching the left half and right half of laser light emitted from the laser 101a (initial laser light), the edges of the laser light 109 can have the central area of the initial laser light where the energy density is enough and attenuation regions of laser beams that have separately passed through mirrors 104a and 104b are synthesized with attenuation regions of other laser beams on the substrate 107. Though not shown in the drawing, a beam collimator for changing a laser beam emitted from the laser 101a into parallel beams and a beam expander for expanding laser light may be placed between the laser 101a and the prism 102a.

The laser beams are then divided in two directions by a mirror 103 and the two beams enter concave cylindrical lenses 105a and 105d through the mirrors 104a and 104b, respectively, to widen the beams in the longitudinal direction. The laser beams reach the substrate 107 after they are collected in the lateral direction by the convex cylindrical lens 106 that has curvature in the lateral direction.

This embodiment uses continuous wave $YVO_4$ lasers as the lasers 101a to 101c, and laser light emitted is converted into the second harmonic. The beam diameter of laser light at the exit of each laser is 2.5 mm. The concave cylindrical lenses 105a to 105 used in this embodiment have a focal length of 100 mm and the convex cylindrical lens 106 is an aspherical lens having a focal length of 20 mm. The distance from the concave cylindrical lenses 105a to 105d to the substrate 107 is set to 100 mm whereas the distance from the convex cylindrical lens 106 to the substrate 107 is set to 20 mm. Laser beams emitted from the lasers 101b and 101c are each shaped into a laser beam that measures 5 mm in the longitudinal direction and 5 μm in the lateral direction on the substrate 107. In this laser light, a 2 mm-width region about the center has enough energy density for annealing whereas the edges are low in energy density and form attenuation region unfit for annealing. Laser light emitted from the laser 101a is shaped into laser light that measures 2.5 mm in the longitudinal direction and 5 μm in the lateral direction on the substrate 107. Regions including attenuation regions of these laser beams are overlapped with one another on the substrate 107 to form a rectangular beam 12 mm in length and 5 μm in width. Laser light formed on the substrate 107 can be increased in length (in the longitudinal direction) by increasing the distance from the substrate 107 to the concave cylindrical lenses 105a to 105d.

The lasers 101a to 101c may be pulse oscillation lasers. For example, YLF lasers that emit laser light having a beam diameter of 30 mm at the laser exit are employed and the laser light is converted into the second harmonic. Through the concave cylindrical lenses 105a to 105d having a focal length of 100 mm and the convex cylindrical lens 106 having a focal length of 20 mm, laser beams from the YLF lasers are each shaped into a laser beam that measures 5 mm×10 mm and attenuation regions of the laser beams are overlapped to form a 5 mm×24 mm laser beam.

Thus formed on the substrate 107 is the rectangular laser light 109 which is longer in length than width and which has enough energy density in every part by using as its edges the sections resulting from division by the prisms 102 and the mirror 103 and by synthesizing attenuation regions in the longitudinal direction with one another.

The substrate 107 is irradiated with the thus formed laser light 109 while moving the laser light 109 relative to the substrate 107 in the directions indicated by 110 and 111, or in the direction indicated by 112. In this way, a desired region of the substrate 107, or the entire region thereof can be annealed efficiently. When this laser irradiation method is used, for example, to crystallize or activate a semiconductor film, the annealing is uniform and efficient. Furthermore, a semiconductor film formed by the present invention improves TFT electric characteristics when it is used to form a TFT. This also improves the operation characteristic and reliability of a semiconductor device that uses the TFT.

The base material of the optical system is preferably BK7 or quartz, for example, to obtain high transmittance. Coating of the optical system is desirably capable of providing 99% or higher transmittance for the wavelength of laser light used.

In this embodiment mode, the light path length from the laser 101a to the irradiation surface is different from the light path length from the lasers 101b and 101c to the irradiation surface. Since laser light has a spread angle although its coherence is excellent, it is desirable for the lasers to have the same light path length to reach the irradiation surface. For that reason, mirrors are interposed between the lasers 101b and 101c and the concave cylindrical lenses 105b and 105c, or other methods are used, to add a light path length so that the light path lengths from the lasers to the irradiation surface are equalized.

The laser light shape on an irradiation surface is rectangular in this embodiment mode but the present invention is not limited thereto. The laser light shape is varied from one type of laser to another type and, for example, laser light emitted from a solid-state laser has a circular or elliptical shape if the rod shape is cylindrical and a rectangular shape if the rod shape is slab-like. The present invention is also applicable to such laser light. In this embodiment mode, attenuation regions in the longitudinal direction of laser beams are synthesized with one another. Alternatively, attenuation regions in the lateral direction may be synthesized or attenuation regions in the lateral direction and the longitudinal direction may be synthesized. However, synthesizing attenuation regions in the longitudinal direction of laser beams is the desirable way for efficient laser annealing with the simplest structure. Regions to be synthesized may include other regions than attenuation regions.

This embodiment mode uses three lasers but the number of lasers is not limited in the present invention except that it has to be more than one.

More detailed description will be given below on the thus structured present invention using the following embodiments.

EMBODIMENT 1

Figure 19:
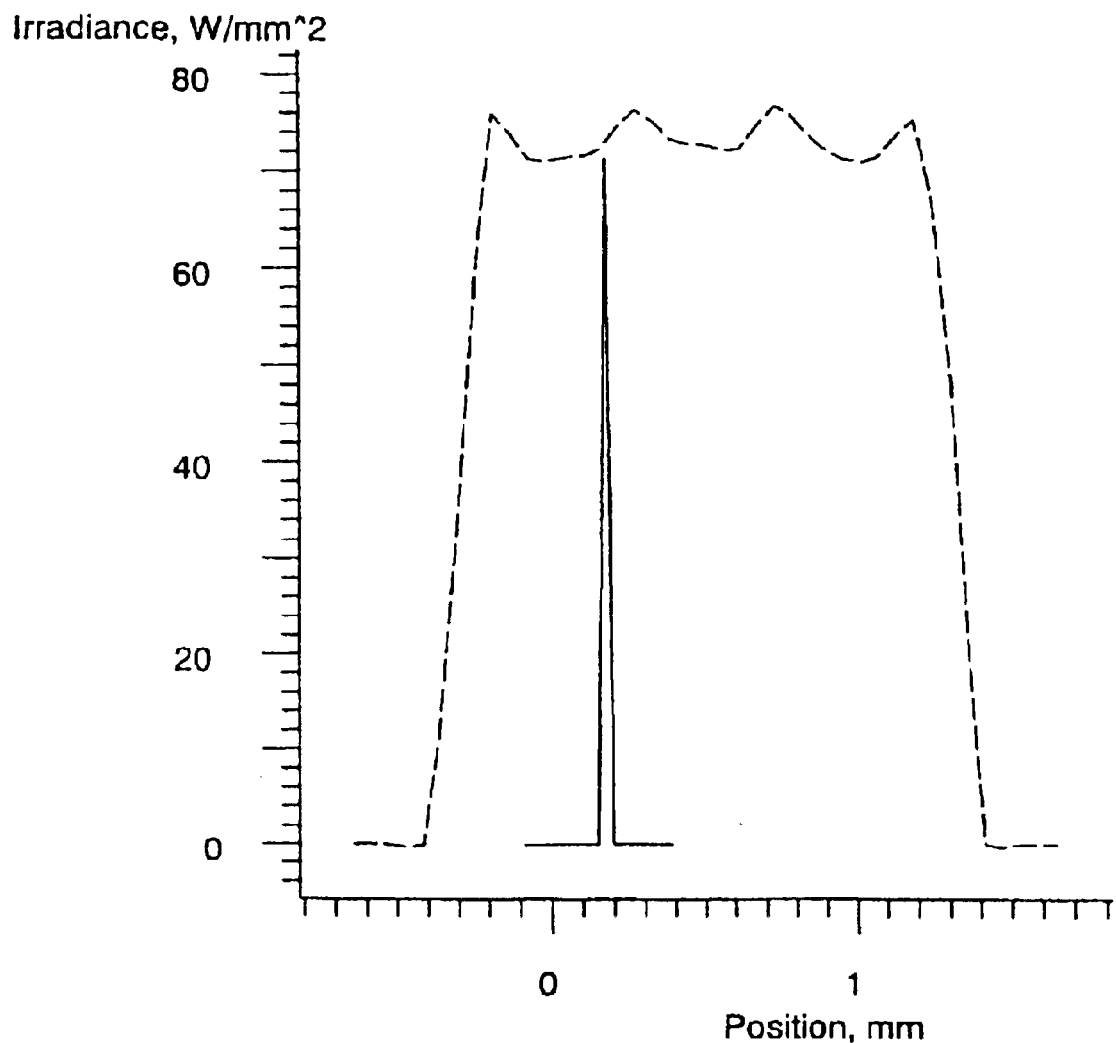
FIG. 19 is a diagram showing an example of the distribution of energy density of a laser beam formed on the irradiation surface disclosed in the present invention.

This embodiment gives a description on energy density suitable for annealing in the present invention with reference to FIG. 19.

FIG. 19 is the simulation result of energy density distribution when one of laser beams emitted from three lasers is divided and attenuation regions of the divided laser beams are synthesized with attenuation regions of other laser beams as shown in FIGS. 1A to 1B. The lasers used here are YAG lasers and laser beams emitted from the lasers are converted into the second harmonic by LBO crystals. The beam diameter of the laser light is set to 2.25 mm ($1/e^2$ width) and the $TEM_\infty$ mode is employed. In FIG. 19, the dotted line indicates the energy density in the longitudinal direction and the solid line indicates the energy density in the lateral direction.

FIG. 19 shows that distribution of the energy density in the longitudinal direction is within ±10% of the average of the energy density except for attenuation regions. A region with crystals of large diameters can be obtained if laser light is within the ±10% energy density distribution.

FIG. 19 also shows that an attenuation region of laser light obtained by the synthesization is 200 μm or less in $1/e^2$ width.

EMBODIMENT 2

Figure 3:
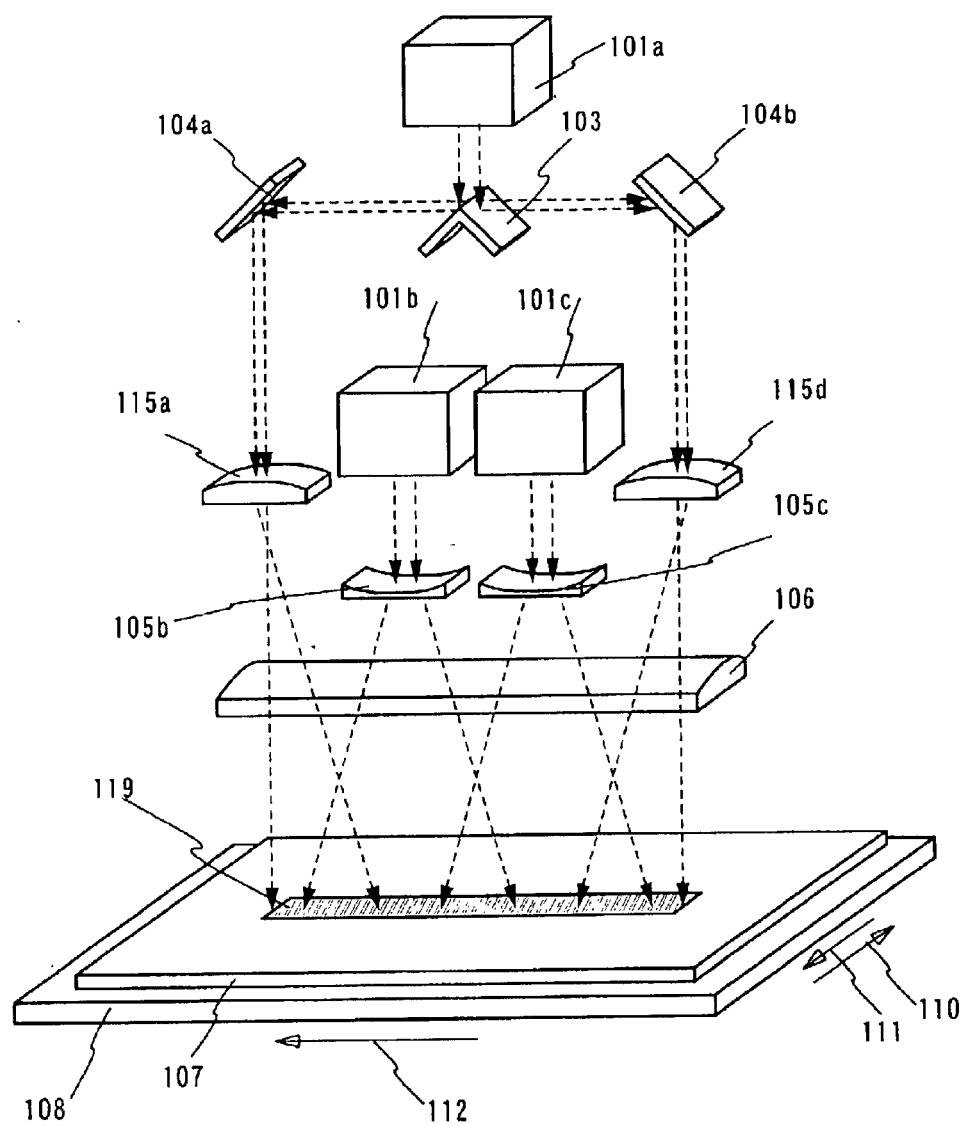
FIG. 3 is a diagram showing an example of a laser irradiation device disclosed in the present invention.

This embodiment describes an example of laser irradiation apparatus for carrying out the present invention with reference to FIG. 3.

Laser beams emitted from lasers 101b and 101c are widened in the longitudinal direction by concave cylindrical lenses 105b and 105c, respectively. Though not shown in the drawing, beam collimators for changing the laser beams emitted from the lasers 101b and 101c into parallel beams and beam expanders for expanding laser light may be placed between the lasers 101b and 101c and the concave cylindrical lenses 105b and 105c. The laser beams reach a substrate 107 after they are collected in the lateral direction by a convex cylindrical lens 106 that has curvature in the lateral direction.

On the other hand, laser light emitted from a laser 101a is divided by a mirror 103 in two directions. Though not shown in the drawing, a beam collimator for changing a laser beam emitted from the laser 101a into parallel beams and a beam expander for expanding laser light may be placed between the laser 101a and the mirror 103. Thereafter the laser beams separately enter convex cylindrical lenses 115a and 115d to collect and then widen the laser beams in the longitudinal direction. This is for forming, on the substrate 107, laser light 119 every part of which has enough energy density. By collecting and then widening in the longitudinal direction the laser light emitted from the laser 101a (initial laser light), the edges of the laser light 119 can have the central area of the initial laser light where the energy density is enough and attenuation regions of laser beams that have separately passed through mirrors 104a and 104b are synthesized with attenuation regions of other laser beams on the substrate 107. The laser beams reach the substrate 107 after they are collected in the lateral direction by the convex cylindrical lens 106 that has curvature in the lateral direction.

Thus formed on the substrate 107 is the rectangular laser light 119 which is longer in length than width and which has enough energy density in every part by using as its edges the sections resulting from division by the mirror 103 and by synthesizing attenuation regions in the longitudinal direction with one another.

The substrate 107 is irradiated with the thus formed laser light 119 while moving the laser light 119 relative to the substrate 107 in the directions indicated by 110 and 111, or in the direction indicated by 112. In this way, a desired region of the substrate 107, or the entire region thereof can be annealed efficiently. When this laser irradiation method is used to crystallize or activate a semiconductor film, the annealing is uniform and efficient. Furthermore, a semiconductor film formed by the present invention improves TFT electric characteristics when it is used to form a TFT. This also improves the operation characteristic and reliability of a semiconductor device that uses the TFT.

The base material of the optical system is preferably BK7 or quartz, for example, to obtain high transmittance. Coating of the optical system is desirably capable of providing 99% or higher transmittance for the wavelength of laser light used.

In this embodiment, the light path length from the laser 101a to the irradiation surface is different from the light path length from the lasers 101b and 101c to the irradiation surface. Since laser light has a spread angle although its coherence is excellent, it is desirable for the lasers to have the same light path length to reach the irradiation surface. For that reason, mirrors are interposed between the lasers 101b and 101c and the concave cylindrical lenses 105b and 105c, or other methods are used, to add a light path length so that the light path lengths from the lasers to the irradiation surface are equalized.

This embodiment uses three lasers but the number of lasers is not limited in the present invention except that it has to be more than one.

EMBODIMENT 3

Figure 4:
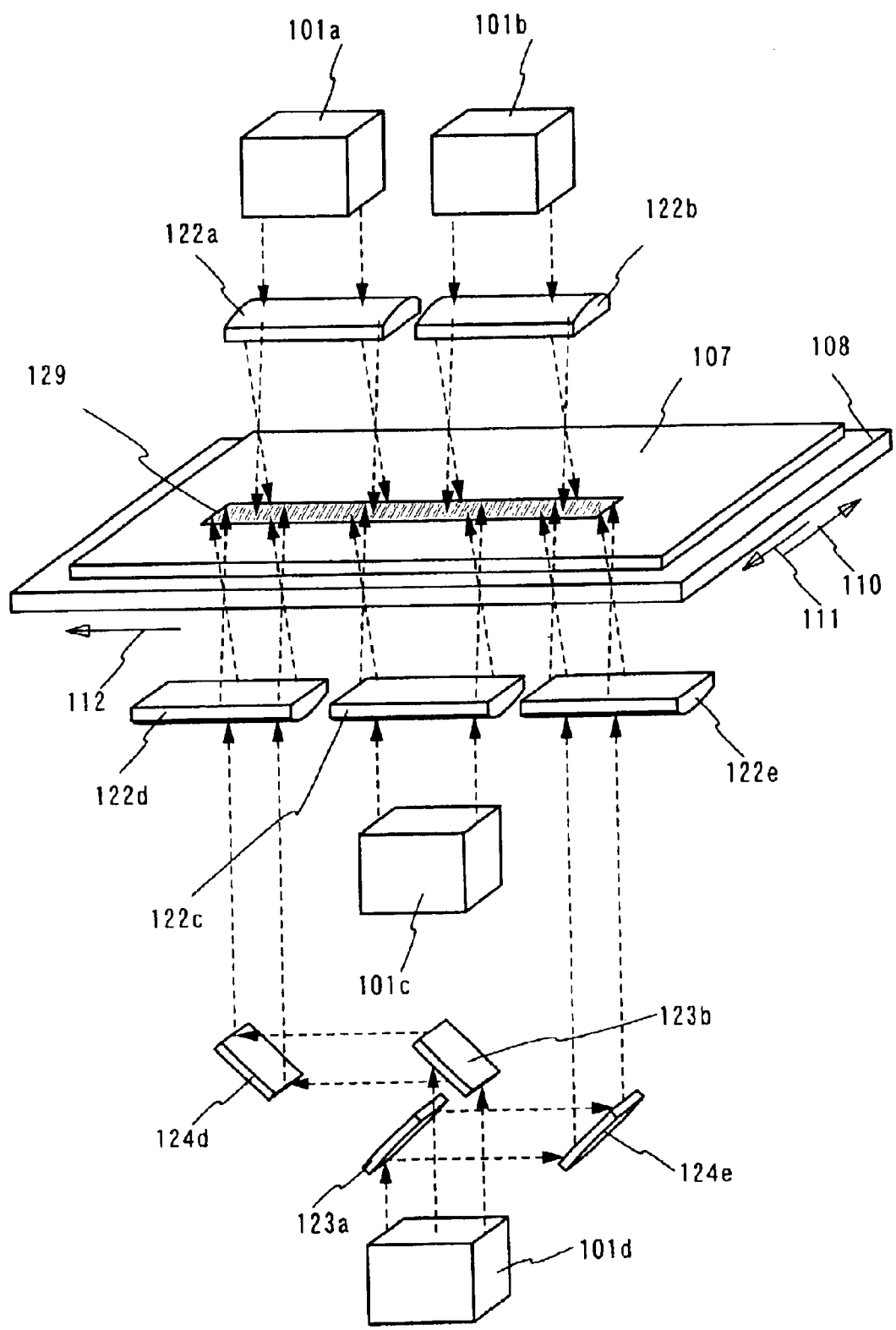
FIG. 4 is a diagram showing an example of a laser irradiation device disclosed in the present invention.

This embodiment describes with reference to FIG. 4 apparatus and method for irradiating a substrate with laser light from lasers placed on both sides of the substrate.

Lasers 101a to 101c are arranged such that they are staggered with respect to a substrate 107. Laser beams emitted from the lasers 101a to 101c are collected in the lateral direction by convex cylindrical lenses 122a to 122c, respectively, and then reach the substrate 107. Though not shown in the drawing, beam collimators for changing the laser beams emitted from the lasers 101a to 101c into parallel beams and beam expanders for expanding laser light may be placed between the lasers 101a to 101c and the convex cylindrical lenses 122a to 122c.

On the other hand, laser light emitted from a laser 101d is divided by mirrors 123a and 123b in two directions. This is for forming, on the substrate 107, laser light 129 every part of which has enough energy density. By dividing the laser light emitted from the laser 101d (initial laser light) in two directions, the edges of the laser light 129 can have the central area of the initial laser light where the energy density is enough and attenuation regions of laser beams that have separately passed through mirrors 124d and 124e are synthesized with attenuation regions of other laser beams on the substrate 107. Though not shown in the drawing, a beam collimator for changing a laser beam emitted from the laser 101d into parallel beams and a beam expander for expanding laser light may be placed between the laser 101d and the mirror 123a. The laser beams reach the substrate 107 after they separately pass through the mirrors 124d and 124e and are collected in the lateral direction by convex cylindrical lenses 122d and 122e that have curvature in the lateral direction.

Thus formed on the substrate 107 is the rectangular laser light 129 which is longer in length than width and which has enough energy density in every part by using as its edges the sections resulting from division by the mirrors 123 and by synthesizing attenuation regions in the longitudinal direction with one another.

The substrate 107 is irradiated with the thus formed laser light 129 while moving the laser light 129 relative to the substrate 107 in the directions indicated by 110 and 111, or in the direction indicated by 112. In this way, a desired region of the substrate 107, or the entire region thereof can be annealed efficiently. When this laser irradiation method is used to crystallize or activate a semiconductor film, the annealing is uniform and efficient. Furthermore, a semiconductor film formed by the present invention improves TFT electric characteristics when it is used to form a TFT. This also improves the operation characteristic and reliability of a semiconductor device that uses the TFT.

Figure 5:
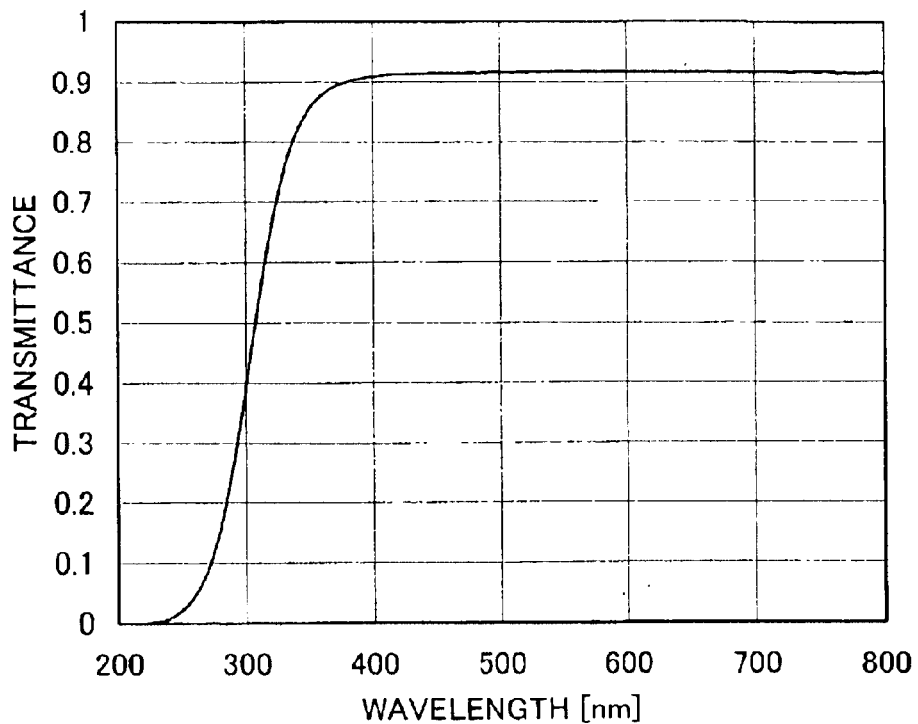
FIG. 5 is a diagram showing a transmission efficiency corresponding to a wavelength in a 1737 glass substrate.
Figure 6:
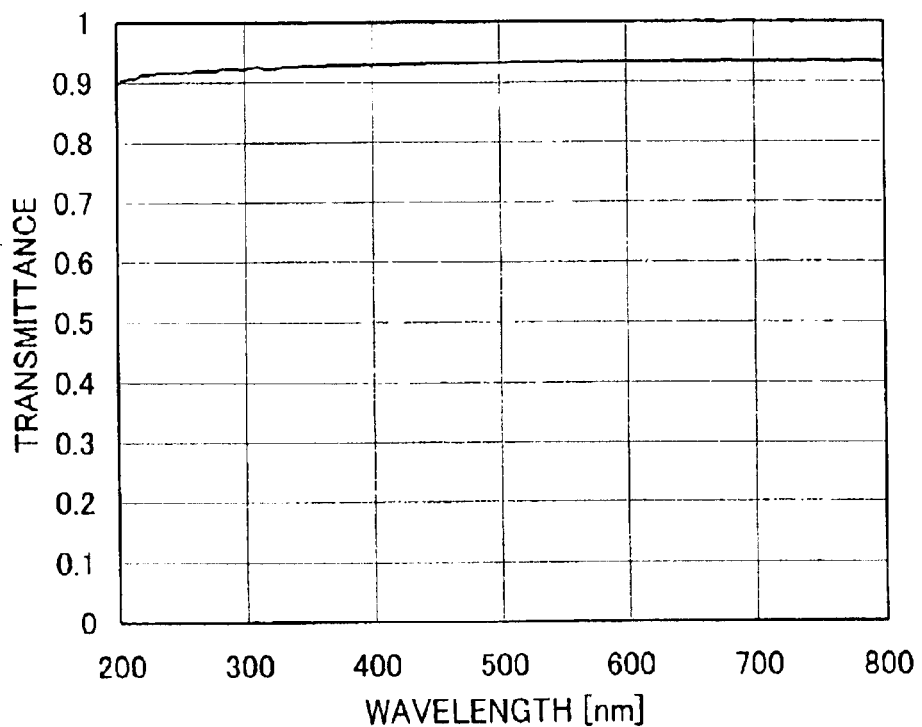
FIG. 6 is a diagram showing a transmission efficiency corresponding to a wavelength in a quartz substrate.

Since lasers are placed on both sides of the substrate in this embodiment, laser light used has to be transmitted through the substrate on which an irradiation object is formed and a stage. FIG. 5 shows the transmittance of a 1737 substrate in relation to the wavelength and FIG. 6 shows the transmittance of a quartz substrate in relation to the wavelength. It is understood from FIGS. 5 and 6 that the transmittance varies depending on what kind of substrate is used and that laser light having a wavelength of 400 nm or higher is preferred for satisfactory annealing of an irradiation object.

In this embodiment, the light path length from the laser 101d to the irradiation surface is different from the light path length from the lasers 101a to 101c to the irradiation surface. Since laser light has a spread angle although its coherence is excellent, it is desirable for the lasers to have the same light path length to reach the irradiation surface. For that reason, mirrors are interposed between the lasers 101a to 101c and the convex cylindrical lenses 122a to 122c, or other methods are used, to add a light path length so that the light path lengths from the lasers to the irradiation surface are equalized. This embodiment uses four lasers but the number of lasers is not limited in the present invention except that it has to be more than one.

In this embodiment, an amorphous silicon film is used as a semiconductor film. However, a semiconductor film in the present invention is not limited thereto and a compound semiconductor film having an amorphous structure, such as an amorphous silicon germanium film, may be used instead.

This embodiment may be combined freely with Embodiment Mode or Embodiment 1 or 2.

EMBODIMENT 4

Figure 7A:
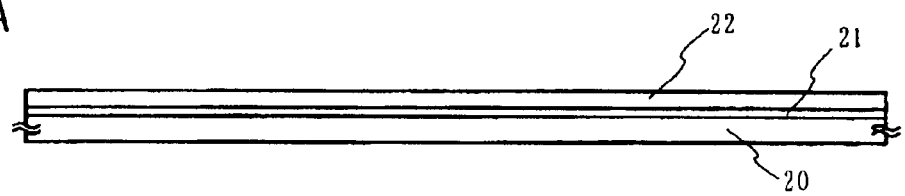
FIGS. 7A and 7B show an example of methods that crystallize the semiconductor film by using the present invention.
Figure 7B:
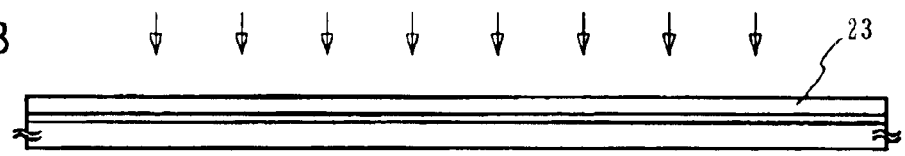

In Embodiment 4, a crystallization method of the semiconductor film performing by using a laser irradiation device of the present invention is described with reference to FIGS. 7A to 7B.

First of all, a glass substrate made of glasses such as barium borosilicate glass and aluminum borosilicate glass, a substrate which has an insulating film on the surface such as a quartz substrate, a silicon substrate, a metal substrate or stainless substrate, can be used as a substrate 20. The substrate 20 may be a plastic substrate having a heat resistance sufficient to against the processing temperature in this embodiment.

Next, a base film 21 made of an insulating film such as silicon oxide film, silicon nitride film, and a silicon oxynitride film is formed on the substrate 20. In this embodiment, a single layer structure is used for the base film 21. However, a structure may be used where a two or more layers film are stacked. In this embodiment, a silicon oxynitride film (compositional ratio: Si=32%, O=59%, N =7%, and H=2%) with a thickness of 400 nm is formed by the plasma CVD method.

Next, a semiconductor layer 22 is formed on the base film 21. The semiconductor layer 22 is formed with a thickness of 25 to 200 nm (preferably 30 to 150 nm) by publicly known method (such as the sputtering method, LPCVD method and plasma CVD method), and the semiconductor film 22 is crystallized by publicly known crystallization method (such as a laser crystallization method, a thermal crystallization method using RTA or a furnace annealing and a thermal crystallization method using a metal element facilitating the crystallization). As the semiconductor films, there are an amorphous semiconductor film, a microcrystalline semiconductor film, and a crystalline semiconductor film, a compound semiconductor film having an amorphous structure such as an amorphous silicon germanium film, an amorphous silicon carbide also can be applied therefor. In this embodiment, plasma CVD method is used to form an amorphous silicon film 55 nm thick.

Next, the crystallization of said semiconductor film is performed. In Embodiment 4, a laser crystallization is performed, the dehydrogenation is performed on this amorphous silicon film (at 500° C. for 3 hours), and the laser annealing method is performed to form the crystalline silicon film 23 thereafter (FIG. 7B).

When a crystalline semiconductor film is produced in accordance with the laser crystallization method, the pulse or the continuous oscillation type of KrF excimer laser, YAG laser, $YVO_4$ laser, YLF laser, $YAlO_3$ laser, $Y_2O_3$ laser, glass laser, ruby laser or Ti: sapphire laser and the like may be applied. When these types of laser are used, a method is preferable whereby laser beam emitted from a laser oscillator is gathered in linear shape by an optical system and is irradiated to a semiconductor film. The condition of the crystallization may be selected by the practitioner as necessary. However, when the pulse oscillation laser is used, the pulse frequency is set to 300 Hz and the laser energy density is set to 100 to 1500 mj/cm² (typically 200 to 1200 mj/cm²). The overlap percentage of the linear beams may be 50 to 98%. Further, when the continuous oscillation laser is used, the laser energy density is preferably to be set to 0.01 to 100 mw/cm² (desirably 0.01 to 10 MW/cm²).

In Embodiment 4, using a second harmonic of the continuous oscillation type YLF laser to form a laser beam in accordance with the optical system shown in Embodiments and Embodiment 2 and Embodiment 3, then shifting the substrate relatively to the laser beam obtained, the substrate is irradiated and the whole surface thereof is crystallized. By using the present invention, uniform annealing is conducted efficiently in an amorphous semiconductor film, thereby obtaining a crystalline semiconductor film. Thus, the TFT obtained from using the semiconductor film forming by the present invention is improved in electrical properties, and besides, the semiconductor device is also improved in operation properties and reliability.

Embodiment 4 can be freely combined with Embodiment Modes and Embodiments 1 to 3.

EMBODIMENT 5

Figure 8A:
FIGS. 8A to 8C show an example of methods that crystallize the semiconductor film by using the present invention.
Figure 8B:
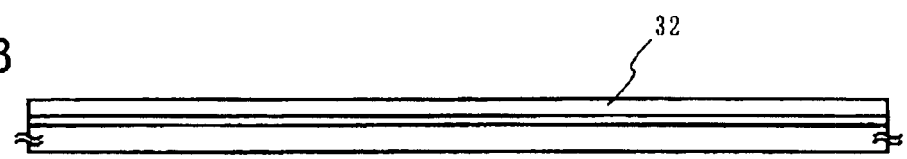
Figure 8C:
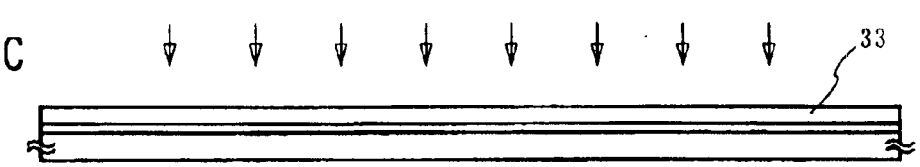
Figure 9A:
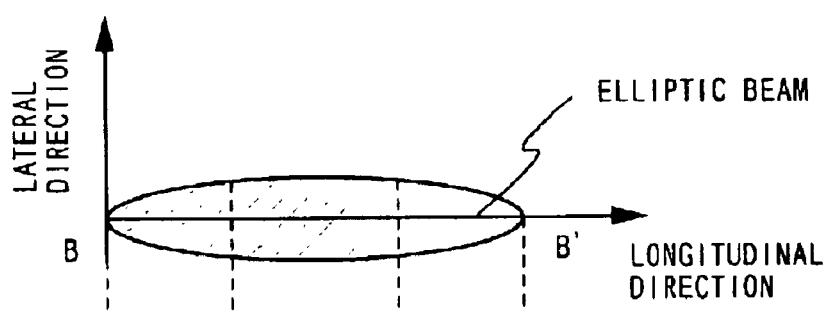
FIGS. 9A and 9B show a laser beam on the irradiated surface and the energy density in prior art.
Figure 9B:
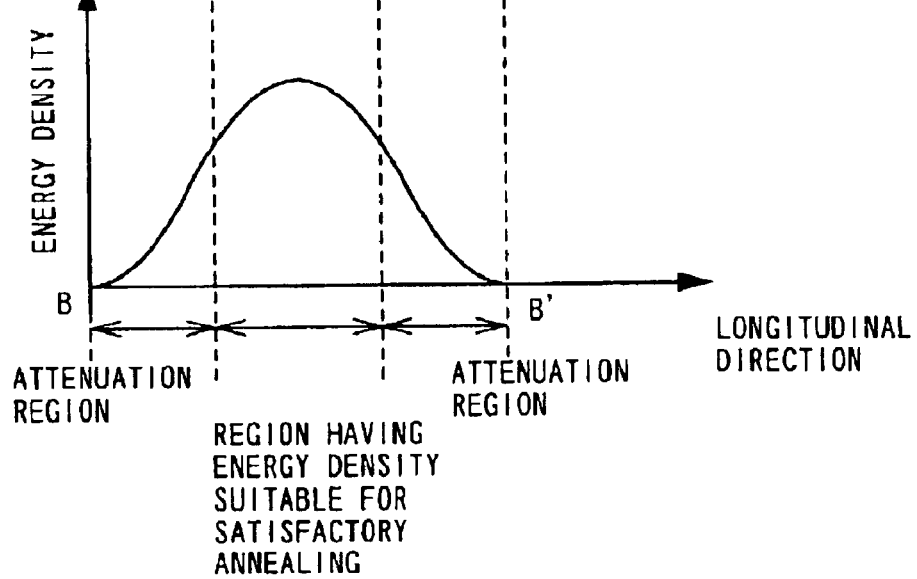

In Embodiment 5, another method of performing the crystallization of a semiconductor film by using a laser irradiation device of the present invention is described with FIGS. 8A to 8C.

First, as a semiconductor film, up to forming an amorphous silicon film is carried out in accordance with Embodiment 4.

A metal containing layer 31 is formed by utilizing a method disclosed in Japanese Patent Application Laid Open No. 7-183540, after a thermal treatment is performed thereon, the crystallinity of semiconductor film is improved by the laser annealing method. In Embodiment 5, nickel acetate aqueous solution (weight converting concentration: 5 ppm, volume: 10 ml) is applied onto the surface of the semiconductor film by spin coating to thereby (FIG. 8A), and thermal treatment (at 500° C. for 1 hour, at 550° C. for 12 hours) is performed to obtain a first crystalline semiconductor film 32 (FIG. 8B). Continuously, by using the laser annealing method, the improvement of the crystallinity of the semiconductor film is performed and a second crystalline semiconductor film 33 is obtained (FIG. 8C).

A laser annealing method is a method using a second harmonic of the continuous oscillation type $YVO_4$ laser to form a laser beam in accordance with the optical system shown in Embodiments and Embodiment 2 and Embodiment 3, and then shifting the substrate relatively to the laser beam obtained, the substrate is irradiated and the whole surface thereof is crystallized. By using the present invention, uniform annealing is conducted efficiently in an amorphous semiconductor film, thereby obtaining a second crystalline semiconductor film. Thus, the TFT obtained from using the semiconductor film forming by the present invention is improved in electrical properties, and besides, the semiconductor device is also improved considerably in operation properties and reliability.

EMBODIMENT 6

In this embodiment, a method of manufacturing an active matrix substrate will be described with reference to FIGS. 10 to 13. A substrate on which a CMOS circuit, a driver circuit, and a pixel portion having a pixel TFT and a storage capacitor are formed together is called active matrix substrate for convenience.

First of all, a substrate 400 formed of glass such as barium borosilicate glass and aluminum borosilicate glass is used in this embodiment. The substrate 400 may be a quartz substrate, a silicon substrate, a metal substrate or stainless substrate, which has an insulating film on the surface. The substrate 400 may be a plastic substrate having a sufficient heat resistance, which withstands a processing temperature in this embodiment. Because this invention can easily form a linear beam with a uniform energy distribution, it is possible that annealing the large area substrate is conducted effectively by using a plurality of linear beams.

Next, a base film 401 made from an insulating film such as a silicon oxide film, a silicon nitride film, or a silicon oxynitride film is then formed on the substrate 400 by the known method. A two layers structure is used as the base film 401 in this embodiment, but a single layer of the above-mentioned insulating film may also be used, and a structure in which more than two layers are laminated may also be used.

Next, semiconductor layers are formed on the base film. First of all, semiconductor film is formed with a thickness of 25 to 200 nm (preferably 30 to 150 nm) by a known method (such as the sputtering method, the LPCVD method, and the plasma CVD method). Then, the semiconductor film is crystallized by a laser crystallization method. As the laser crystallization method, the laser beam irradiates to the semiconductor film by applying one of Embodiment Modes and Embodiments 1 to 3 or by freely combining any one of Embodiments 1 to 3. It is preferable that a solid-state laser, a gas laser, or metallic laser of continuous oscillation or pulse oscillation is used. Note that, as the solid-state laser, there may be given a YAG laser, a $YVO_4$ laser, a YLF laser, a $YAlO_3$ laser, a $Y_2O_3$ laser, a glass laser, a ruby laser, an alexandrite laser, a Ti:sapphire laser, and the like of continuous oscillation or pulse oscillation. As a the gas laser, there may be given a laser of continuous oscillation or pulse oscillation such as KrF excimer laser, Ar laser, Kr laser, $CO_2$ laser, or the like of continuous oscillation or pulse oscillation. And as the metallic laser, there may be given a laser of continuous oscillation or pulse oscillation such as helium cadmium laser, a copper vapor laser, or a gold vapor laser. Of course, not only the laser crystallization method but also any other known crystallization methods (RTA, the thermal crystallization method using a furnace annealing, the thermal crystallization method using metallic elements which promote crystallization) may also be combined. The semiconductor film may be an amorphous semiconductor film, a microcrystal semiconductor film or a crystalline semiconductor film. Alternatively, the semiconductor film may be a compound semiconductor film having an amorphous structure such as an amorphous silicon germanium film, an amorphous silicon carbide film and the like.

In this embodiment, plasma CVD method is used to form an amorphous silicon film with a thickness of 50 nm, and then the thermal crystallization method using metallic elements, which promote crystallization, and laser crystallization method are used for the amorphous silicon film. Nickel is used as a metal element, and is introduced onto the amorphous silicon film by a solution coating method. Then heat treatment is conducted at 500° C. for five hours, whereby obtaining a first crystalline silicon film. Subsequently, after the laser beam shot from a continuous oscillation $YVO_4$ laser with output 10 W is converted into a second higher harmonic wave by a nonlinear optical element, a second crystalline silicon film is obtained in accordance with Embodiment 2. Irradiating the laser beam to the first crystalline silicon film, and changing the first crystalline silicon film to the second crystalline silicon film improve the crystallinity of the second crystalline silicon film. Further, a ridge formed on the surface of the semiconductor film can be reduced by performing the second laser annealing. At this moment, approximately 0.01 to 100 $MW/cm^2$ (preferably 0.1 to 10 $MW/cm^2$) is necessary for the energy density. The stage is relatively moved to the laser beam at a speed of approximately 0.5 to 2000 cm/s, and it irradiates, and then the crystalline silicon film is formed. When the excimer laser of pulse oscillation is used, it is preferable that 300 Hz of frequency and 100 to 1500 $mj/cm^2$ (typically, 200 to 1300 $mj/cm^2$) of laser energy density are used. At this moment, laser beam may be overlapped by 50 to 98%.

Of course, although a TFT can be formed by using the first crystalline silicon film, it is preferable that the second crystalline silicon film is used to form the TFT since the second crystalline silicon film has an improved crystallinity and electric properties of TFT. For instance, although, when TFT is formed by using the first crystalline silicon film, a mobility is almost 300 $cm^2/Vs$, when TFT is formed by using the second crystalline silicon film, the mobility is extremely improved with approximately 500 to 600 $cm^2/Vs$.

The semiconductor layers 402 to 406 are formed by performing patterning processing on thus obtained semiconductor film by using the photolithography method.

Doping of a very small amount of an impurity element (boron or phosphorous) may be performed after forming the semiconductor layers 402 to 406 in order to control a TFT threshold value.

A gate insulating film 407 is formed next, covering the semiconductor layers 402 to 406. The gate insulating film 407 is formed by an insulating film containing silicon with a thickness of 40 to 150 nm using plasma CVD or sputtering. In this embodiment, a silicon oxynitride film having a film thickness of 110 nm is formed by plasma CVD method. The gate insulating film is of course not limited to a silicon oxynitride film, and other insulating films containing silicon may be used in a single layer or in a lamination structure.

Further, if a silicon oxide film is used, it can be formed by plasma CVD method with a mixture of TEOS (Tetraethyl Orthosilicate) and $O_2$, at a reaction pressure of 40 Pa, with the substrate temperature set from 300 to 400° C., and by discharging at a high frequency (13.56 MHz) electric power density of 0.5 to 0.8 $W/cm^2$. Good properties as a gate insulating film can be obtained by subsequently performing thermal annealing, at between 400 and 500° C., of the silicon oxide film thus manufactured.

A first conductive film 408 having a film thickness of 20 to 100 nm, and a second conductive film 409 having a film thickness of 100 to 400 nm are then formed and laminated on the gate insulating film 407 (FIG. 10A). The first conductive film 408, made from a TaN film having a film thickness of 30 nm, and the second conductive film 409, made from a W film having a film thickness of 370 nm, are formed and laminated in this embodiment. The TaN film is formed by sputtering, and sputtering of a Ta target is performed in a nitrogen atmosphere. Further, the W film is formed by sputtering using a W target. In addition, the W film can also be formed by thermal CVD method using tungsten hexafluoride ($WF_6$). Whichever is used, it is necessary to be able to make the film become low resistance in order to use it as a gate electrode, and it is preferable that the resistivity of the W film be made less than 20 μΩcm.

Note that although the first conductive film 408 is TaN and the second conductive film 409 is W in this embodiment, there are no particular limitations placed on the conductive films. The first conductive film 408 and the second conductive film 409 may also be formed from an element selected from the group consisting of Ta, W, Ti, Mo, Al, Cu, Cr, and Nd, or from an alloy material having one of these elements as its main constituent, or from a chemical compound of these elements. Further, a semiconductor film, typically a polycrystalline crystalline silicon film, into which an impurity element such as phosphorous is doped may also be used, as may an AgPdCu alloy.

Masks 410 to 415 are formed next from resist using a photolithography method, and a first etching process is performed in order to form electrodes and wirings. The first etching processing is performed in accordance with first and second etching conditions (FIG. 10B). An ICP (Inductively Coupled Plasma) etching method is used as a first etching condition in this embodiment. A gas mixture of $CF_4$, $Cl_2$, and $O_2$ is used as an etching gas, the gas flow rates are set to 25:25:10 (sccm), respectively, a plasma is generated by supplying a 500 W RF (13.56 MHz) electric power to a coil shape electrode at a pressure of 1 Pa, and etching is performed. A 150 W RF (13.56 MHz) electric power is also applied to the substrate side (sample stage), thereby applying a substantially negative self-bias voltage. The W film is etched under the first etching conditions, and the edge portion of the first conductive layer is made into a tapered shape.

The etching conditions are changed to a second etching condition without removing the masks 410 to 415 made of resist. A gas mixture of $CF_4$ and $Cl_2$ is used as an etching gas, the gas flow rates are set to 30:30 (sccm), respectively, a plasma is generated by applying a 500 W RF (13.56 MHz) electric power to a coil shape electrode at a pressure of 1 Pa, and etching is performed for approximately 30 seconds. A 20 W RF (13.56 MHz) electric power is also supplied to the substrate side (sample stage), thereby applying a substantially negative self-bias voltage. The W film and the TaN film are both etched by on the same order by the second etching conditions using the gas mixture of $CF_4$ and $Cl_2$. Note that the etching time may be increased on the order of 10 to 20% in order to perform etching such that no residue remains on the gate insulating film.

Edge portions of the first conductive layer and the second conductive layer are made into a tapered shape in accordance with the effect of a bias voltage, applied to the substrate side, by making the shapes of the resist masks suitable with the above-mentioned first etching condition. The angle of the tapered portions is from 15 to 45°. First shape conductive layers 417 to 422 (first conductive layers 417a to 422a, and second conductive layers 417b to 422b) are thus formed from the first conductive layers and the second conductive layers by the first etching process. Reference numeral 416 denotes a gate insulating film, and regions not covered by the first shape conductive layers 417 to 422 become thinner by approximately 20 to 50 nm through etching.

A second etching process is then performed without removing the masks made of resist (FIG. 10C). Here, W film is selectively etched by using $CF_4$, $Cl_2$, and $O_2$ for the etching gas. At this time, the second conductive layers 428b to 433b are formed by the second etching process. On the other hand, the first conductive layers 417a to 422a are hardly etched and the second shape of the first conductive layers 428a to 433a are formed.

A first doping process is then performed without removing the masks made of resist and the semiconductor layer is added to the impurity element that imparts n-type at a low concentration. The doping process may be performed by ion doping method or ion injection method. Ion doping is performed with process conditions in which the dosage is set from $1\times10^{13}$ to $5\times10^{14}/cm^2$, and the acceleration voltage is set between 40 to 80 keV. Doping is performed in this embodiment with the dosage set to $1.5\times10^{13}/cm^2$, and the acceleration voltage set to 60 keV. An element belonging to the group 15, typically phosphorous (P) or arsenic (As) is used as an impurity element that imparts n-type. Phosphorous (P) is used here. In this case the conductive layers 428 to 433 act as masks with respect to the impurity element that imparts n-type conductivity, and the impurity regions 423 to 427 are formed in a self-aligning manner. The impurity element which imparts n-type is added to the impurity regions 423 to 427 at a concentration in a range of $1\times10^{18}$ to $1\times10^{20}/cm^3$.

Next, after removing the masks made of resist, new masks 434a to 434c made of resist are formed, and the second doping process is performed in higher acceleration voltage than the first doping process. Ion doping is performed with process conditions in which the dosage is set from $1\times10^{13}$ to $1\times10^{15}/cm^2$, and the acceleration voltage is set between 60 to 120 keV. The doping process is performed by using the second conductive layers 428b to 432b as masks and the semiconductor layer under the tapered portion of the first conductive layer is added to the impurity element. Continuously the acceleration voltage is lowered than the second doping process, the third doping process is done, and the state of FIG. 11A is obtained. Ion doping method is performed with process conditions in which the dosage is set from $1\times10^{15}$ to $1\times10^{17}/cm^2$, and the acceleration voltage is set between 50 to 100 keV. Low concentration impurity regions 436, 442 and 448 overlapping with the first conductive layer are added to the impurity element, which imparts n-type within the range of the density of $1\times10^{18}$ to $5\times10^{19}/cm^2$ by the second doping process and the third doping process and high concentration impurity regions 435, 441, 444 and 447 are added to the impurity element, which imparts n-type within the range of the density of $1\times10^{19}$ to $5\times10^{21}/cm^2$.

Of course, the second doping process and the third doping process can be one-time doping process by making it to a suitable acceleration voltage and it is also possible to form the low concentration impurity region and high concentration impurity region.

Next, after removing the masks made of resist, new masks 450a to 450c made from resist are formed and the fourth doping process is performed. Impurity regions 453, 454, 459 and 460, to which an impurity element which imparting a conductivity type opposite to that of the above one conductivity type is added, are formed in accordance with the fourth doping process in the semiconductor films which become active layers of the p-channel type TFTs. The second conductive layers 429b and 432b are used as masks with respect to the impurity element, and an impurity element which imparts p-type conductivity is added to form the impurity regions in a self-aligning manner. The impurity regions 453, 454, 459 and 460 are formed by ion doping method using diborane ($B_2H_6$) in this embodiment (FIG. 11B). The semiconductor layers for forming the n-channel type TFT are covered with the masks 450a to 450c made of resist when the fourth doping process is performed. Phosphorous is added at different concentrations into the impurity regions 453, 454, 459 and 460 by the first to third doping processes. However, by performing doping such that the concentration of the impurity element that imparts p-type conductivity becomes from $1\times10^{19}$ to $5\times10^{21}$ atoms/cm$^3$ in the respective regions, no problems develop in making the regions function as source regions and drain regions of the p-channel type TFT.

The impurity regions are thus formed in respective semiconductor layers by the steps up through this point.

A first interlayer insulating film 461 is formed next after removing the masks 450a to 450c made of resist. This first interlayer insulating film 461 is formed from an insulating film containing silicon, having a thickness of 100 to 200 nm, by using plasma CVD method or sputtering method. A silicon oxynitride film having a thickness of 150 nm is formed by plasma CVD method in this embodiment. The first interlayer insulating film 461 is of course not limited to a silicon oxynitride film, and other insulating films containing silicon may also be used, as a single layer or a lamination structure.

Subsequently, a recovery of the crystallinity of the semiconductor layer and an activation of the impurity elements added to the respective semiconductor layers are performed by irradiating the laser beam. As the laser activation, the laser beam irradiates to the semiconductor film by applying one of Embodiments 1 to 4 or by freely combining with these embodiments. It is preferable that a laser of a continuous oscillation or a pulse oscillation such as a solid-state laser, a gas laser, or metallic laser is used. Note that, as the solid-state laser, there may be given a laser of a continuous oscillation or a pulse oscillation such as a YAG laser, a YVO$_4$ laser, a YLF laser, a YAlO$_3$ laser, a Y$_2$O$_3$ laser, a glass laser, a ruby laser, an alexandrite laser, a Ti:sapphire laser, and the like. As the gas laser, there may be given a laser of continuous oscillation or pulse oscillation such as KrF excimer laser, Ar laser, Kr laser, CO$_2$ laser, or the like. And as the metallic laser, there may be given a laser of continuous oscillation or pulse oscillation such as a helium cadmium laser, a copper vapor laser, or a gold vapor laser. At this moment, if a continuous oscillation laser is used, approximately 0.01 to 100 MW/cm$^2$ (preferably 0.1 to 10 MW/cm$^2$) is necessary for the energy density of laser beam. The substrate is relatively moved to the laser beam at a speed of approximately 0.5 to 2000 cm/s. And, if a pulse oscillation laser is used, it is preferable that 300 Hz of frequency and 50 to 1000 mj/cm$^2$ (typically, 50 to 500 mj/cm$^2$) of laser energy density are used. At this moment, laser beam may be overlapped by 50 to 98%. Besides laser annealing method, thermal annealing method or rapid thermal annealing method (RTA method) and the like can be applied.

Further, the activation may also be performed before the formation of a first interlayer insulating film. However, if the wiring material used is weak with respect to heat, then it is preferable to perform the activation processing after forming an interlayer insulating film (an insulating film having silicon as its main constituent, for example a silicon nitride film) in order to protect the wirings and the like, as in this embodiment.

Then, a heat treatment can also be performed (at 300 to 550° C. for 1 to 12 hours) and it is possible to conduct a hydrogenation. This process is one of terminating dangling bonds in the semiconductor layers by hydrogen contained within the first interlayer insulating film 461. The semiconductor layers can be hydrogenated whether or not the first interlayer insulating film exists. Plasma hydrogenation (using hydrogen excited by a plasma), and a heat treatment for 1 to 12 hours at a temperature of 300 to 450° C. in an atmosphere containing hydrogen of from 3 to 100% may also be performed as other means of hydrogenation (FIG. 11C).

Subsequently, a second interlayer insulating film 462 made from an inorganic insulating film material or from an organic insulating material is formed on the first interlayer insulating film 461. An acrylic resin film having a film thickness of 1.6 μm is formed in this embodiment, and the material used may have a viscosity from 10 to 1000 cp, preferably between 40 to 200 cp. A material in which unevenness is formed on its surface is used.

In order to prevent mirror reflection, the surface of a pixel electrode is made uneven by forming a second interlayer insulating film that forms an uneven surface in this embodiment. Further, the pixel electrode surface can be made to be uneven and have light scattering characteristics, and therefore a convex portion may also be formed in a region below the pixel electrode. The formation of the convex portion can be performed by the same photomask as that for forming the TFTs, and therefore it can be formed without increasing the number of process steps. Note that the convex portion may also be formed appropriately on the substrate of the pixel portion region except the wirings and TFTs. In this way, unevenness is formed in the surface of the pixel electrode along the unevenness formed in the surface of the insulating film that covers the convex portion.

A film having a level surface may also be used as the second interlayer insulating film 462. In this case, it is preferable that the surface be made uneven by an added process such as a known sandblasting process or etching process to prevent mirror reflection, and thereby increasing whiteness by scattering reflected light.

Figure 12:
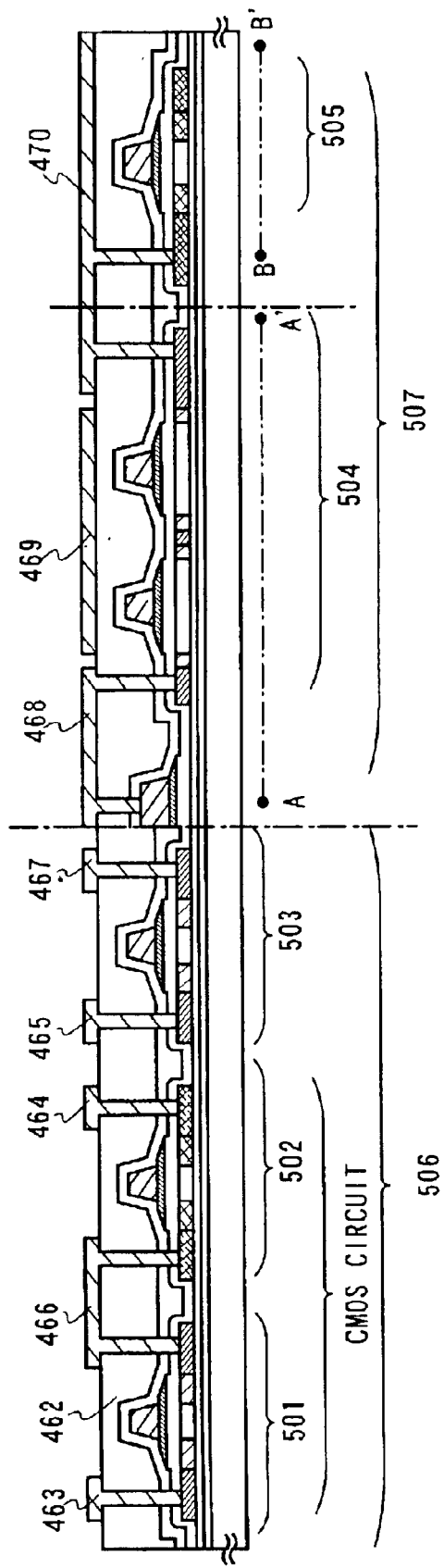
FIG. 12 is a cross-sectional view showing the steps of manufacturing pixel TFTs and TFTs for driver circuits.

Wirings 463 to 467 for electrically connecting respective impurity regions are then formed in a driver circuit 506. Note that a lamination film of a Ti film having a thickness of 50 nm and an alloy film (an alloy of Al and Ti) having a thickness of 500 nm is patterned in order to form the wirings. Of course, it is not limited to the two-layer structure, the single-layer structure or the lamination structure more than three layers may also be acceptable. Further, wiring materials are not limited to Al and Ti. For example, Al and Cu are formed on TaN film, and the lamination film forming the Ti film is formed by the patterning and form wiring (FIG. 12).

Further, a pixel electrode 470, a gate wiring 469, and a connection electrode 468 are formed in a pixel portion 507. An electrical connection is formed with the pixel TFT and the source wiring (a lamination layer of 433a and 433b) by the connection electrode 468. Further, the gate wiring 469 forms an electrical connection with the gate electrode of the pixel TFT. The pixel electrode 470 forms an electrical connection with the drain region of the pixel TFT, and in addition, forms an electrical connection with the semiconductor layer that functions as one electrode forming a storage capacitor. It is preferable to use a material having superior reflectivity, such as a film having Al or Ag as its main constituent, or a lamination film of such films, as the pixel electrode 470.

A CMOS circuit composed of an n-channel TFT 501 and a p-channel TFT 502, a driver circuit 506 having an n-channel TFT 503, and the pixel portion 507 having a pixel TFT 504 and a storage capacitor 505 can thus be formed on the same substrate. The active matrix substrate is thus completed.

The n-channel TFT 501 of the driver circuit 506 has: a channel forming region 437; a low concentration impurity region 436 (GOLD region) which overlaps with the first conductive layer 428a that structures a portion of the gate electrode; and a high concentration impurity region 452 which functions as a source region or a drain region. The p-channel TFT 502, which forms the CMOS circuit with the n-channel TFT 501 and the electrode 466 by an electrical connection has: a channel forming region 440; a high concentration impurity region 453 functioning as a source region or a drain region, a low concentration impurity region 454. Further, the n-channel TFT 503 has: a channel forming region 443; a low concentration impurity region 442 (GOLD region) which overlaps with the first conductive layer 430a that structures a portion of the gate electrode; and a high concentration impurity region 456 which functions as a source region or a drain region.

The pixel TFT 504 of the pixel portion has: a channel forming region 446; a low concentration impurity region 445 (LDD region) formed on the outside of the gate electrode; and a high concentration impurity region 458 which functions as a source region or a drain region. Further, an impurity element that imparts n-type and an impurity element, which imparts p-type, are added to the semiconductor layer which functions as one electrode of the storage capacitor 505. The storage capacitor 505 comprises an electrode (lamination of 432a and 432b) and the semiconductor layer, with the insulating film 416 functioning as a dielectric.

Edge portions of the pixel electrodes are disposed so as to overlap with source wirings such that gaps between the pixel electrodes shield the light, without using a black matrix, with the pixel structure of this embodiment.

Figure 13:
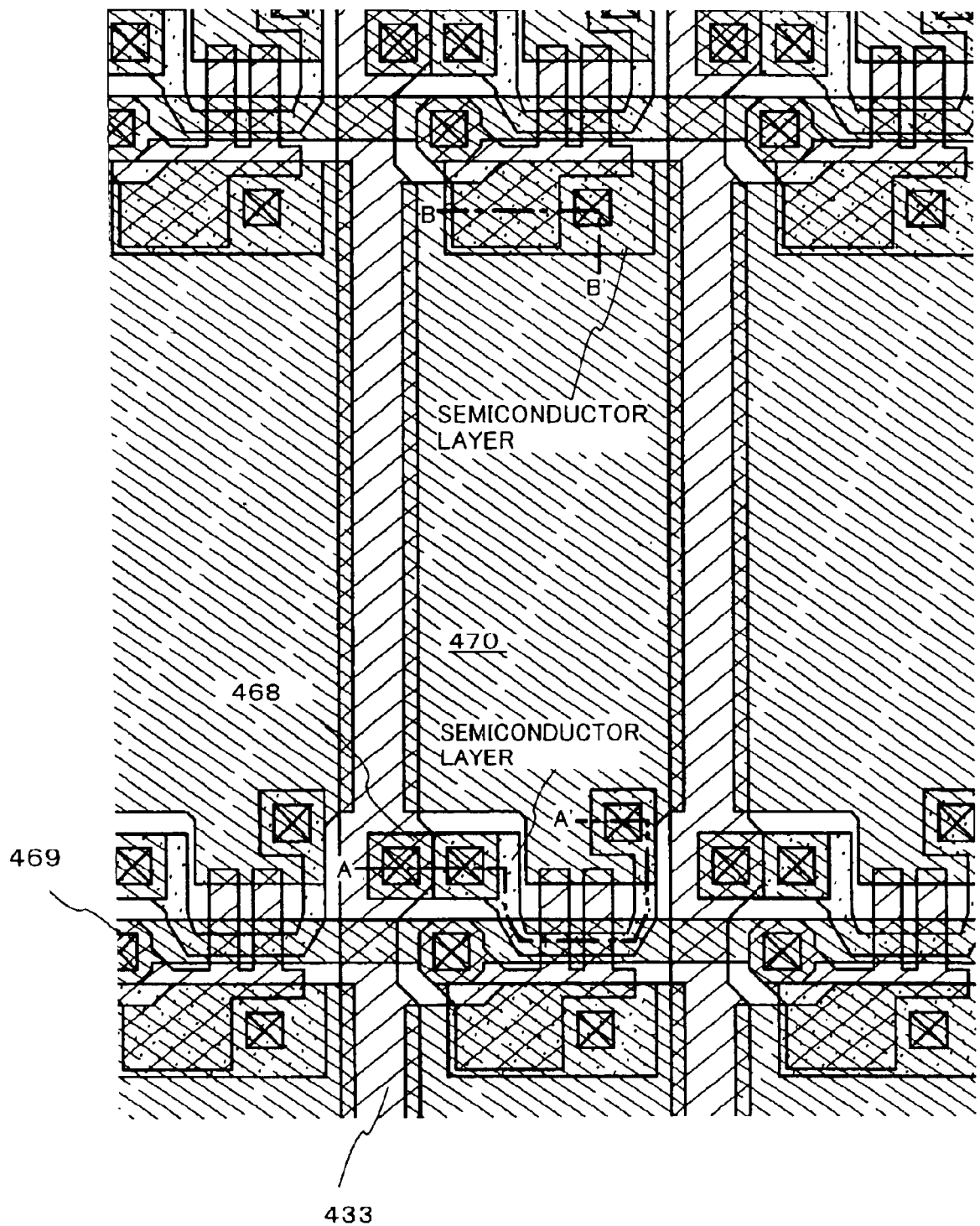
FIG. 13 is a top view showing the configuration of pixel TFTs.

A top view of the pixel portion of the active matrix substrate manufactured in this embodiment is shown in FIG. 13. Note that the same reference symbols are used for portions corresponding to those in FIGS. 10 to 13. A chain line A–A' in FIG. 12 corresponds to a cross sectional diagram cut along a chain line A–A' within FIG. 13. Further, a chain line B–B' in FIG. 12 corresponds to a cross sectional diagram cut along a chain line B–B' within FIG. 13.

EMBODIMENT 7

Figure 14:
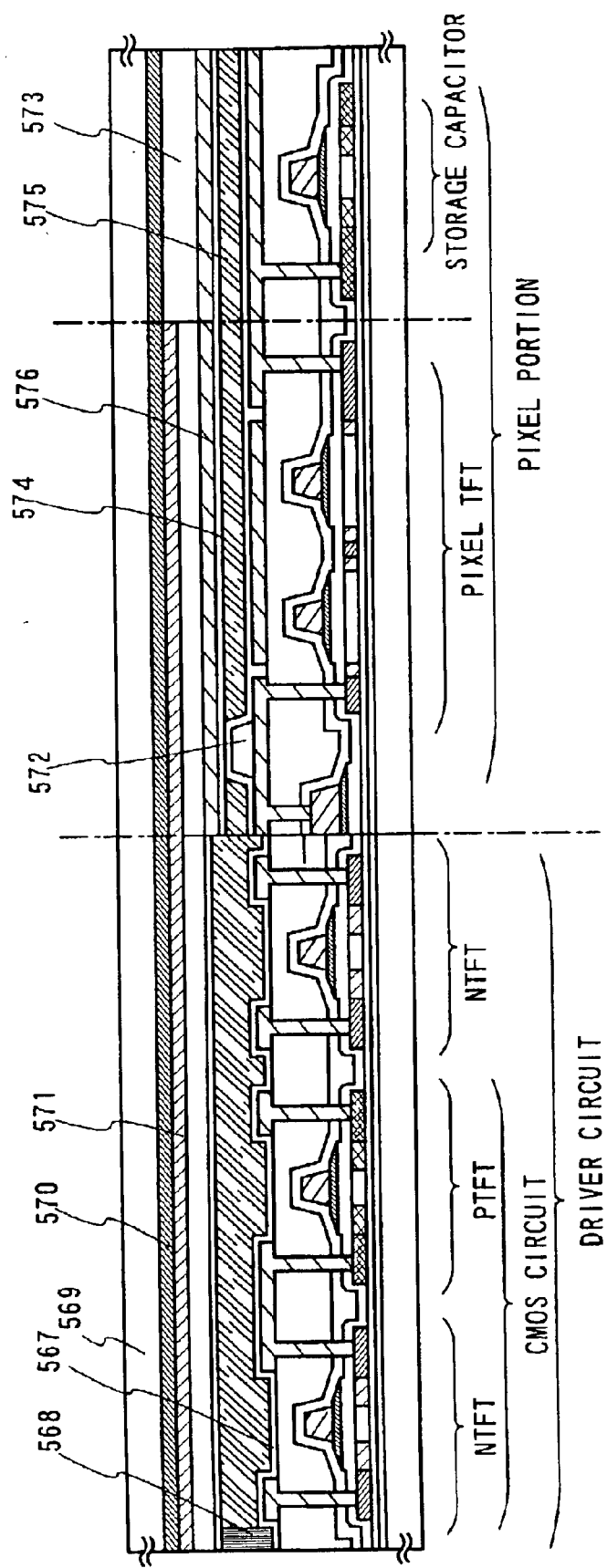
FIG. 14 is a cross-sectional view showing the steps of manufacturing an active matrix liquid crystal display device.

A process of manufacturing a reflection type liquid crystal display device from the active matrix substrate manufactured in Embodiment 6 is explained below in this embodiment. FIG. 14 is used in the explanation.

An active matrix substrate in the state of FIG. 12 is first obtained in accordance with Embodiment 6, an orientation film 567 is then formed on at least the pixel electrode 470 on the active matrix substrate of FIG. 12, and a rubbing process is performed. Note that, before forming the orientation film 567 in this embodiment, columnar spacer 572 is formed in desired positions by patterning an organic resin film, such as an acrylic resin film and the like, in order to maintain a gap between substrates. Further, spherical spacers may also be distributed over the entire surface of the substrate as a substitute for the columnar spacers.

An opposing substrate 569 is prepared next. Coloring layers 570 and 571, and a leveling film 573 are then formed on the opposing substrate 569. The red coloring layer 570 and a blue coloring layer 571 are overlapped to form a light shielding portion. Furthermore, the light shielding portion may also be formed by overlapping a portion of the red coloring layer with a green coloring layer.

The substrate shown in Embodiment 6 is used in this embodiment. Therefore, with the top view of the pixel portion of Embodiment 6 shown in FIG. 13, it is necessary that, at least, the gap between the gate wiring 469 and the pixel electrode 470, the gap between the gate wiring 469 and the connection electrode 468, and the gap between the connection electrode 468 and the pixel electrode 470 be shielded from light. Each of the coloring layers are arranged such that the light shielding portions made from the lamination of the coloring layers are formed in positions that must be shielded from light, and then are joined to the opposing substrate.

It is thus made possible to reduce the number of process steps by performing light shielding of the respective gaps between the pixels by using the light shielding portions, composed of the laminations of the coloring layers, without forming a light shielding layer such as a black mask and the like.

An opposing electrode 576 made from a transparent conductive film is formed on the leveling film 573 over at least the pixel portion, an orientation film 574 is formed over the entire surface of the opposing substrate, and a rubbing process is performed.

The active matrix substrate on which the pixel portion and the driver circuit are formed, and the opposing substrate are then joined by a sealing material 568. A filler is mixed into the sealing material 568, and the two substrates are joined while maintaining a uniform gap in accordance with the filler and the columnar spacers. A liquid crystal material 575 is then injected between both substrates, and the substrates are completely sealed by using a sealant (not shown in the figure). A known liquid crystal material may be used for the liquid crystal material 575. The reflection type liquid crystal display device shown in FIG. 14 is thus completed. The active matrix substrate or the opposing substrate is then cut into a desired shape if necessary. In addition, a polarizing plate (not shown in the figure) is attached to only the opposing substrate. An FPC is then attached using a known technique.

Liquid crystal display device made by above-mentioned method has TFT manufactured by using the semiconductor film annealed uniformly by a laser beam having sufficient energy density. It is possible to become the one with enough operation properties and reliability of the above-mentioned liquid crystal display device. Such a liquid crystal display can be used as a display portion in various kinds of electronic equipment.

Note that it is possible to freely combine this embodiment with Embodiments 1 to 6.

EMBODIMENT 8

In this embodiment, an example of manufacturing the light emitting device by using a manufacturing method of TFT that is used for forming an active matrix substrate as shown in Embodiment 6 will be described. In this specification, the light emitting device is the general term for the display panel enclosed a light emitting element formed on the substrate between the aforesaid substrate and the cover member, and to the aforesaid display module equipped TFT with the aforesaid display panel. Incidentally, the light emitting element has a layer including a compound in which an electroluminescence can be obtained by applying an electric field (a light emitting layer), an anode, and a cathode. Meanwhile, the electroluminescence in organic compound includes the light emission (fluorescence) upon returning from the singlet-excited state to the ground state and the light emission (phosphorescence) upon returning from the triplet-excited state to the ground state, including any or both of light emission.

In this specification, all layers formed between the anode and the cathode in the light emitting element are defined as the organic light emitting layer. The light emitting layer, the hole injection layer, the electron injection layer, the hole transportation layer, and the electron transportation layer, etc. are concretely included in the organic light emitting layer. The light emitting element basically has the structure that the anode layer, the light emitting layer, and the cathode layer are sequentially laminated. In addition to this structure, the light emitting element may also has a structure that the anode layer, the hole injection layer, the light emitting layer, and the cathode layer are sequentially laminated or a structure that the anode layer, the hole injection layer, the light emitting layer, the hole transportation layer, and the cathode layer etc. are sequentially laminated.

Figure 15:
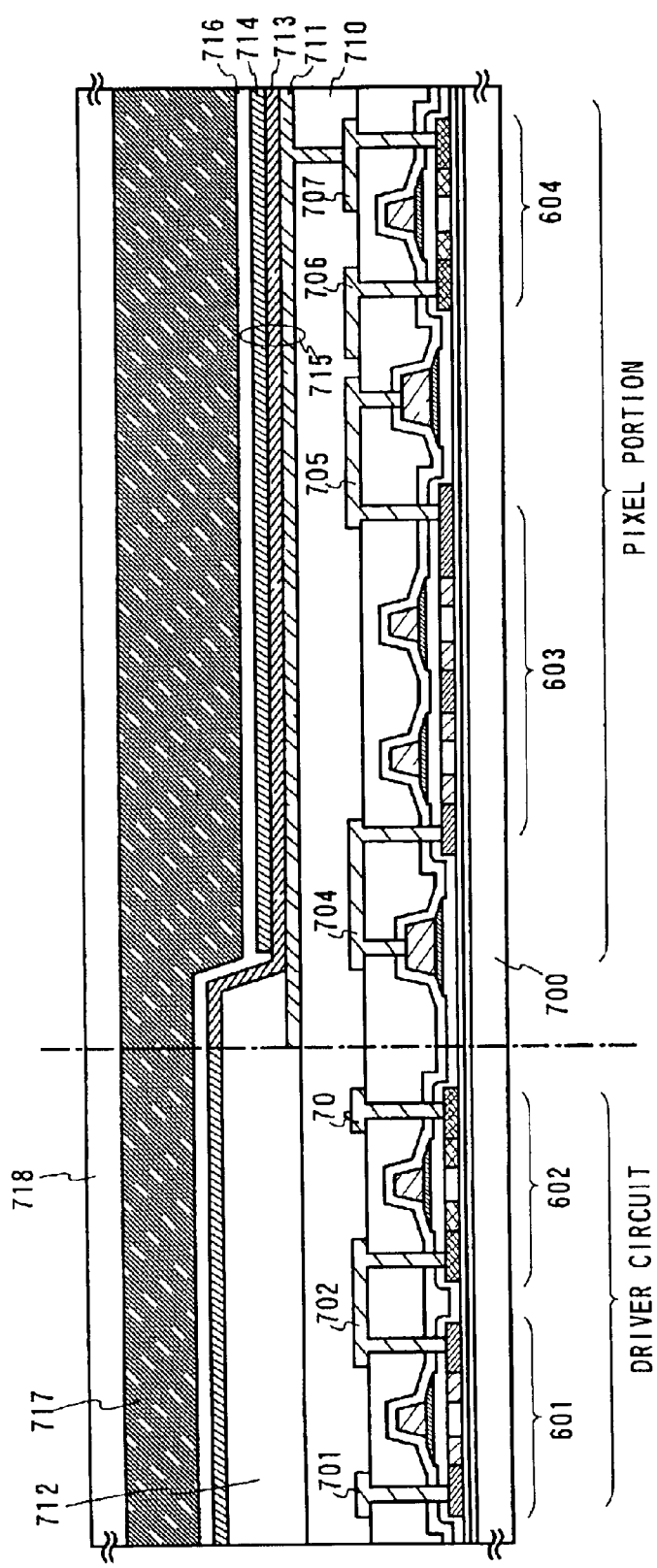
FIG. 15 is a cross-sectional view showing the configuration of a driver circuit and a pixel portion in a light emitting device.

FIG. 15 is a sectional view of a light emitting device of this embodiment. In FIG. 15, the switching TFT 603 provided on the substrate 700 is formed by using the n-channel TFT 503 of FIG. 12. Consequently, concerning the explanation of the structure, it is satisfactory to refer the explanation on the n-channel TFT 503.

Incidentally, although this embodiment is of a double gate structure formed with two channel regions, it is possible to use a single gate structure formed with one channel region or a triple gate structure formed with three.

The driver circuit provided on the substrate 700 is formed by using the CMOS circuit of FIG. 12. Consequently, concerning the explanation of the structure, it is satisfactory to refer the explanation on the n-channel TFT 601 and p-channel TFT 602. Incidentally, although this embodiment is of a single gate structure, it is possible to use a double gate structure or a triple gate structure.

Meanwhile, the wirings 701, 703 serve as source wirings of the CMOS circuit while the wiring 702 as a drain wiring. Meanwhile, a wiring 704 serves as a wiring to electrically connect between the source wiring 708 and the source region of the switching TFT while the wiring 705 serves as a wiring to electrically connect between the drain wiring 709 and the drain region of the switching TFT.

Incidentally, a current control TFT 604 is formed by using the p-channel TFT 502 of FIG. 12. Consequently, concerning the explanation of the structure, it is satisfactory to refer to the explanation on the p-channel TFT 502. Incidentally, although this embodiment is of a single gate structure, it is possible to use a double gate structure or a triple gate structure.

Meanwhile, the wiring 706 is a source wiring of the current control TFT (corresponding to a current supply line) while the wiring 707 is an electrode to be electrically connected to the pixel electrode 711.

Meanwhile, reference numeral 711 is a pixel electrode (anode of a light-emitting element) formed by a transparent conductive film. A compound of indium oxide and tin oxide, a compound of indium oxide and zinc oxide, zinc oxide, tin oxide or indium oxide, or otherwise a transparent conductive film as above added with gallium may be used as the transparent conductive film. The pixel electrode 711 is formed on a planar interlayer insulating film 710 prior to forming the wirings. In this embodiment, it is very important to planarize the step due to the TFT by using a resin planarizing film 710. A light-emitting layer to be formed later, because being extremely small in thickness, possibly causes poor light emission due to the presence of a step. Accordingly, it is desired to provide planarization prior to forming a pixel electrode so that a light-emitting layer can be formed as planar as possible.

After forming the wirings 701 to 707, a bank 712 is formed as shown in FIG. 15. The bank 712 may be formed by patterning an insulating film or organic resin film containing silicon having 100 to 400 nm.

Incidentally, because the bank 712 is an insulating film, caution must be paid to element electrostatic breakdown during deposition. In this embodiment added is a carbon particle or metal particle to an insulating film as a material for the bank 712, thereby reducing resistivity and suppressing occurrence of static electricity. In such a case, the addition amount of carbon or metal particle may be adjusted to provide a resistivity of $1\times10^6$ to $1\times10^{12}$ Ωm (preferably $1\times10^8$ to $1\times10^{10}$ Ωm).

A light emitting layer 713 is formed on the pixel electrode 711. Incidentally, although FIG. 15 shows only one pixel, this embodiment separately forms the light-emitting layer correspondingly to the respective colors of R (red), G (green) and B (blue). Meanwhile, in this embodiment is formed a low molecular weight organic light emitting material by the deposition process. Specifically, this is a lamination structure having a copper phthalocyanine (CuPc) film provided in a thickness of 20 nm as a hole injecting layer and a tris-8-qyuinolinolato aluminum complex ($Alq_3$) film provided thereon in a thickness of 70 nm as a light-emitting layer. The color of emission light can be controlled by adding a fluorescent pigment, such as quinacridone, perylene or DCM1, to $Alq_3$.

However, the foregoing example is an example of organic light emitting material to be used for a light-emitting layer and not necessarily limited to this. It is satisfactory to form a light-emitting layer (layer for light emission and carrier movement therefore) by freely combining a light-emitting layer, a charge transporting layer and an electron injecting layer. For example, although in this embodiment was shown the example in which a low molecular weight organic light emitting material is used for a light-emitting layer, it is possible to use an intermediate organic light emitting material and a high molecular weight organic light emitting material. Furthermore, an organic light-emitting material, having no sublimation property but having molecules in the number of 20 or less or chained molecules having a length of 10 μm or less, is provided as a intermediate molecular organic light emitting material. For an example of using the high molecular weight organic light emitting material, a polythiophene (PEDOT) film with a thickness of 20 nm is formed by the spin coating method as a hole injection layer and the lamination structure installing paraphenylenvinylene (PPV) of approximately 100 nm on it as a light emitting layer may be good. The luminescence wavelength can be selected from red to blue by using the π-conjugated type polymer of PPV. Meanwhile, it is possible to use an inorganic material such as silicon carbide for an electron transporting layer or charge injecting layer. These organic light emitting materials or inorganic materials can be a known material.

Next, a cathode 714 of a conductive film is provided on the light-emitting layer 713. In this embodiment, as the conductive film used is an alloy film of aluminum and lithium. Of course, a known MgAg film (alloy film of magnesium and silver) may be used. As the cathode material may be used a conductive film of an element belonging to the periodic-table group 1 or 2, or a conductive film added with such an element.

A light-emitting element 715 is completed at a time having formed up to the cathode 714. Incidentally, the light-emitting element 715 herein refers to a diode formed with a pixel electrode (anode) 711, a light-emitting layer 713 and a cathode 714.

It is effective to provide a passivation film 716 in such a manner to completely cover the light-emitting element 715. The passivation film 716 is formed by an insulating film including a carbon film, a silicon nitride film or a silicon oxynitride film, and used is an insulating film in a single layer or a combined lamination.

In such a case, it is preferred to use a film favorable in coverage as a passivation film. It is effective to use a carbon film, particularly DLC (diamond-like carbon) film. The DLC film, capable of being deposited in a temperature range not more than 100° C. from room temperature, can be easily deposited over the light-emitting layer 713 low in heat resistance. Meanwhile, the DLC film, having a high blocking effect to oxygen, can suppress the light-emitting layer 713 from oxidizing. Consequently, the problem of oxidation can be prevented in the light-emitting layer 713 during the following sealing process.

Furthermore, a sealing member 717 is provided on the passivation film 716 so as to bond a cover member 718. For the sealing member 717 used may be an ultraviolet curable resin. It is effective to provide therein a substance having a hygroscopic effect or an antioxidant effect. Meanwhile, in this embodiment, for the cover member 718 used is a glass substrate, quartz substrate or plastic substrate (including a plastic film) having carbon films (preferably diamond-like carbon films) formed on the both surfaces thereof. In addition to the carbon film, the aluminum film (such as AlON, AlN, and AlO), SiN and the like are used.

Thus, completed is a light emitting device having a structure as shown in FIG. 15. Incidentally, it is effective to continuously carry out, without release to the air, the process to form a passivation film 716 after forming a bank 712 by using a deposition apparatus of a multi-chamber scheme (or in-line scheme). In addition, with further development it is possible to continuously carry out the process up to bonding a cover member 718, without release to the air.

In this manner, n-channel TFTs 601, p-channel TFTs 602, a switching TFT (n-channel TFT) 603 and a current control TFT (p-channel TFT) 604 are formed on the substrate 700.

Furthermore, as was explained using FIG. 15, by providing an impurity region overlapped with the gate electrode through an insulating film, it is possible to form an n-channel TFT resistive to the deterioration resulting from hot-carrier effect. Consequently, a light emitting device with high reliability can be realized.

Meanwhile, this embodiment shows only the configuration of the pixel portion and driver circuit. However, according to the manufacturing process in this embodiment, besides these, it is possible to form on the same insulating member such logic circuits as a signal division circuit, a D/A converter, an operation amplifier, a γ-correction circuit or the like. Furthermore, a memory or microprocessor can be formed.

Light emitting display devices made by above-mentioned method has TFT manufactured by using the semiconductor film annealed uniformly by a laser beam having sufficient energy density. It is possible to become the one with enough operation properties and reliability of the above-mentioned light emitting display devices. Such light emitting display devices can be used as a display portion in various kinds of electronic equipment.

Note that it is possible to freely combine this embodiment with Embodiments 1 to 6.

EMBODIMENT 9

Various semiconductor devices (active matrix type liquid crystal display device, active matrix type light emitting device or active matrix type EC display device) can be formed by applying the present invention. Specifically, the present invention can be embodied in electronic equipment of any type in which such an electro-optical device is incorporated in a display portion.

Such electronic equipment is a video camera, a digital camera, a projector, a head-mounted display (goggle type display), a car navigation system, a car stereo, a personal computer, a mobile information terminal (such as a mobile computer, a mobile telephone or an electronic book etc.) or the like. FIGS. 16A to 16F, 17A to 17D, and 18A to 18C show some of its examples.

FIG. 16A shows a personal computer which includes a main body 3001, an image input portion 3002, a display portion 3003, a keyboard 3004 and the like. The personal computer of the present invention can be completed by applying the semiconductor device manufactured by the present invention to the display portion 3003.

FIG. 16B shows a video camera which includes a main body 3101, a display portion 3102, a sound input portion 3103, operating switches 3104, a battery 3105, an image receiving portion 3106 and the like. The video camera of the present invention can be completed by applying the semiconductor device manufactured by the present invention to the display portion 3102.

FIG. 16C shows a mobile computer which includes a main body 3201, a camera portion 3202, an image receiving portion 3203, an operating switch 3204, a display portion 3205 and the like. The mobile computer of the present invention can be completed by applying the semiconductor device manufactured by the present invention to the display portion 3205.

FIG. 16D shows a goggle type display which includes a main body 3301, a display portion 3302, arm portions 3303 and the like. The goggle type display of the present invention can be completed by applying the semiconductor device manufactured by the present invention to the display portion 3302.

FIG. 16E shows a player using a recording medium on which a program is recorded (hereinafter referred to as the recording medium), and the player includes a main body 3401, a display portion 3402, speaker portions 3403, a recording medium 3404, operating switches 3405 and the like. This player uses a DVD (Digital Versatile Disc), a CD and the like as the recording medium, and enables a user to enjoy music, movies, games and the Internet. The recording medium of the present invention can be completed by applying the semiconductor device manufactured by the present invention to the display portion 3402.

FIG. 16F shows a digital camera which includes a body 3501, a display portion 3502, an eyepiece portion 3503, operating switches 3504, an image receiving portion (not shown) and the like. The digital camera of the present invention can be completed by applying the semiconductor device manufactured by the present invention to the display portion 3502.

Figure 17A:
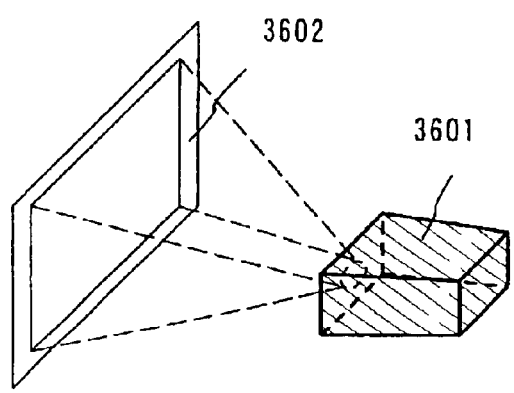
FIGS. 17A to 17D are examples of the semiconductor device.

FIG. 17A shows a front type projector that includes a projection device 3601, a screen 3602 and the like. The front type projector can be completed by applying the semiconductor device manufactured by the present invention to not only a liquid crystal display device 3808 that constitutes a part of the projection device 3601 but also other driver circuits.

Figure 17B:
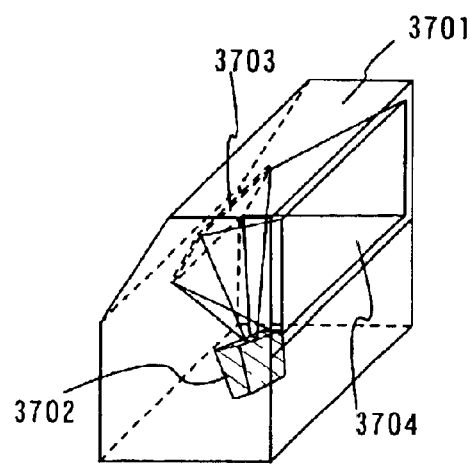

FIG. 17B shows a rear type projector which includes a main body 3701, a projection device 3702, a mirror 3703, a screen 3704 and the like. The rear type projector can be completed by applying the semiconductor device manufactured by the present invention to not only the liquid crystal display device 3808 that constitutes a part of the projection device 3702 but also other driver circuits.

Figure 17C:
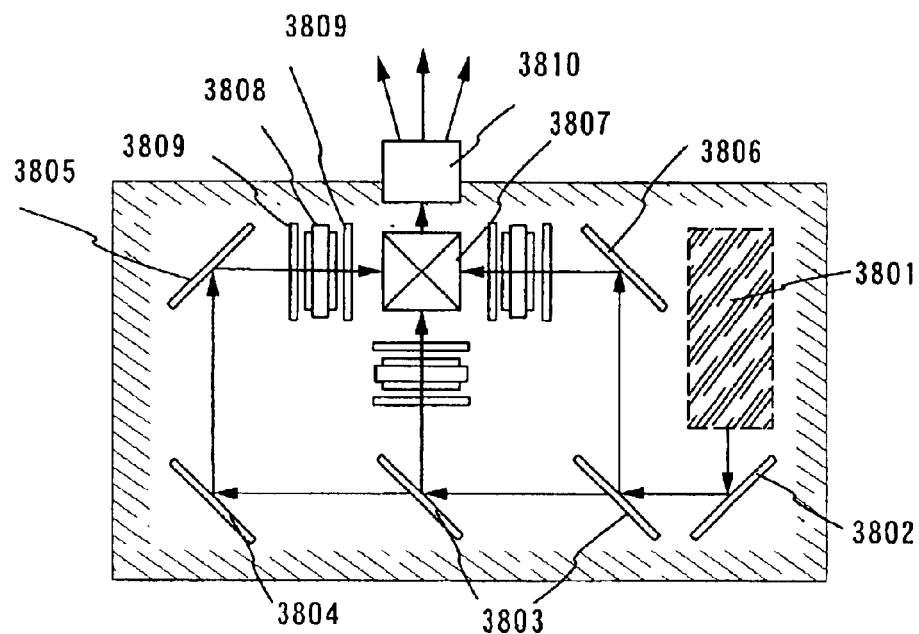

FIG. 17C shows one example of the structure of each of the projection devices 3601 and 3702 which are respectively shown in FIGS. 17A and 17B. Each of the projection devices 3601 and 3702 is made of a light source optical system 3801, mirrors 3802 and 3804 to 3806, a dichroic mirror 3803, a prism 3807, a liquid crystal display device 3808, a phase difference plate 3809 and a projection optical system 3810. The projection optical system 3810 is made of an optical system including a projection lens. Present embodiment is an example of a three-plate type, but it is not limited to this embodiment and may also be of a single-plate type. In addition, those who embody the invention may appropriately dispose an optical system such as an optical lens, a film having a polarization function, a film for adjusting phase difference, an IR film or the like in the path indicated by arrows in FIG. 17C.

Figure 17D:
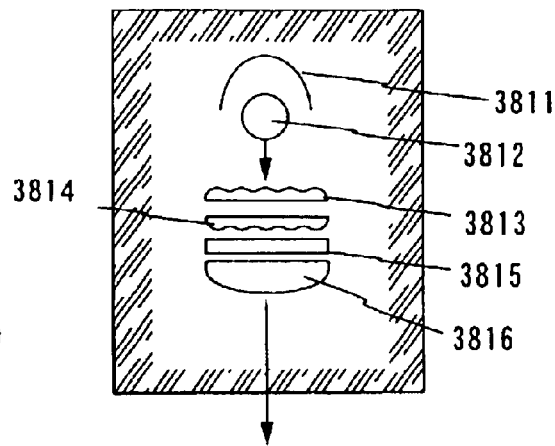

FIG. 17D is a view showing one example of the structure of the light source optical system 3801 shown in FIG. 17C. In this embodiment, the light source optical system 3801 is made of a reflector 3811, a light source 3812, lens arrays 3813 and 3814, a polarizing conversion element 3815 and a condenser lens 3816. Incidentally, the light source optical system shown in FIG. 17D is one example, and the invention is not particularly limited to the shown construction. For example, those who embody the invention may appropriately dispose an optical system such as an optical lens, a film having a polarization function, a film for adjusting phase difference, an IR film or the like.

The projector shown in FIGS. 17A to 17D is of the type using a transparent type of electro-optical device, but there is not shown an example in which the invention is applied to a reflection type of electro-optical device and a light emitting device.

Figure 18A:
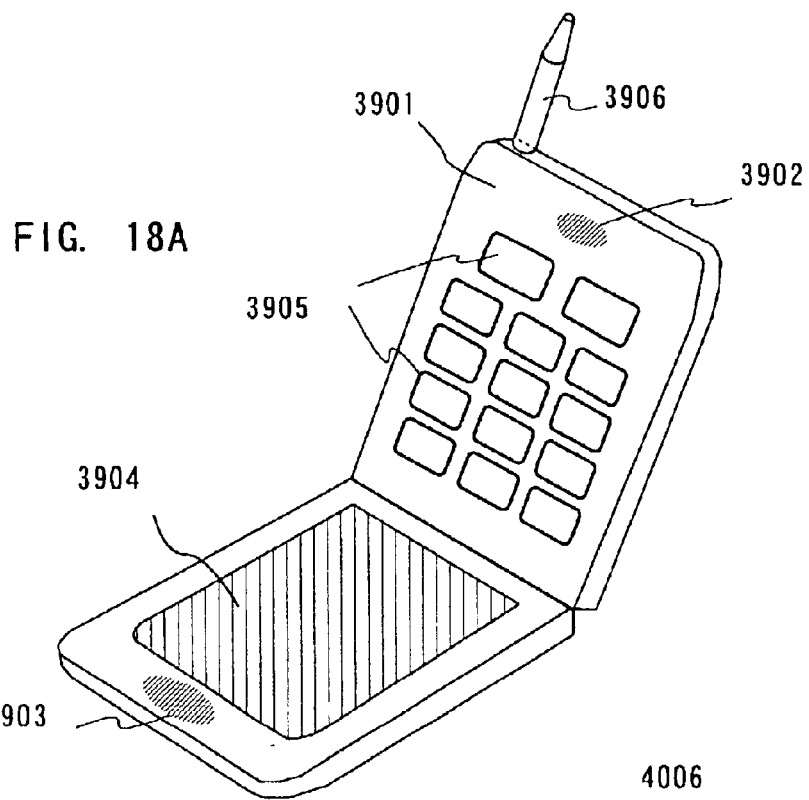
FIGS. 18A to 18C are examples of the semiconductor device.

FIG. 18A shows a mobile telephone which includes a main body 3901, a sound output portion 3902, a sound input portion 3903, a display portion 3904, operating switches 3905, an antenna 3906 and the like. The mobile telephone of the present invention can be completed by applying the semiconductor device manufactured by the present invention to the display portion 3904.

Figure 18B:
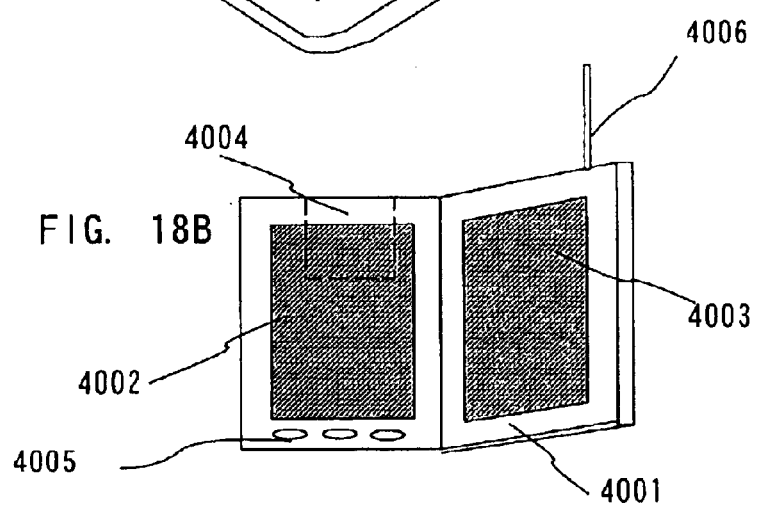

FIG. 18B shows a mobile book (electronic book) which includes a main body 4001, display portions 4002 and 4003, a storage medium 4004, operating switches 4005, an antenna 4006 and the like. The mobile book of the present invention can be completed by applying the semiconductor device manufactured by the present invention to the display portions 4002 and 4003.

Figure 18C:
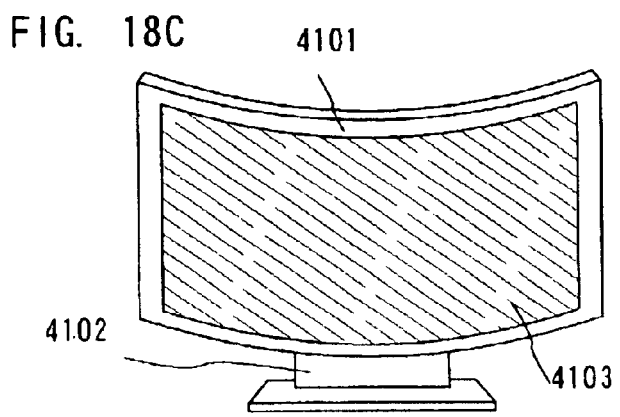

FIG. 18C shows a display which includes a main body 4101, a support base 4102, a display portion 4103 and the like. The display of the present invention can be completed by applying the semiconductor device manufactured by the present invention to the display portion 4103. The invention is particularly advantageous to a large-screen display, and is advantageous to a display having a diagonal size of 10 inches or more (particularly, 30 inches or more).

As is apparent from the foregoing description, the range of applications of the invention is extremely wide, and the invention can be applied to any category of electronic apparatus. Electronic apparatus according to the invention can be realized by using a construction made of a combination of arbitrary ones of Embodiments 1 to 7 and 8.

The fundamental significances indicated as follows can be obtained by employing a configuration of the present invention:

(a) Laser light having a very superior energy density distribution can be produced on a surface to be irradiated or a surface of its vicinity.

(b) Uniform annealing can be conducted for an object to be irradiated. It is particularly suitable for performing the crystallization, crystallinity improvement of the semiconductor film, and activation of impurity elements.

(c) Throughput can be improved.

(d) When the above advantages are satisfied, improvements of operating properties and reliability of a semiconductor device represented by an active matrix liquid crystal display device can be realized. Further, a reduction in a manufacturing cost of a semiconductor device can be realized.

What is claimed is:

1. A laser irradiation apparatus comprising:
   a plurality of lasers;
   at least one optical unit for choosing one laser beam out of plural laser beams emitted from the plural lasers to cut a spot of the laser beam into two; and
   at least one optical unit for synthesizing the other plural laser beams and two divided laser beams into one laser light on an irradiation object,
   wherein the divided laser beams are distanced from each other on the irradiation object.

2. An apparatus according to claim 1, wherein the laser light obtained by synthesizing has a linear shape.

3. An apparatus according to claim 1, wherein the linear laser light has a wavelength of 400 nm or higher.

4. An apparatus according to claim 1, wherein the spot of the laser beam is divided into equal parts.

5. An apparatus according to claim 1, wherein the lasers are continuous wave or pulse oscillation solid-state lasers or gas lasers or metal lasers.

6. An apparatus according to claim 1, wherein each of the lasers is selected from the group consisting of a continuous wave and pulse oscillation of YAG laser, $YVO_4$ laser, YLF laser, $YAlO_3$ laser, $Y_2O_3$ laser, glass laser, ruby laser, alexandrite laser, and Ti:sapphire laser.

7. An apparatus according to claim 1, wherein each of the lasers is selected from the group consisting of a continuous wave and pulse oscillation of excimer laser, Ar laser, Kr laser, and $CO_2$ laser.

8. An apparatus according to claim 1, wherein each of the lasers is selected from the group consisting of a continuous wave and pulse oscillation of helium cadmium laser, copper steam laser, and gold steam laser.

9. An apparatus according to claim 1, wherein the laser beams are converted into harmonic by a non-linear optical element.

10. A laser irradiation apparatus comprising:
    a plurality of lasers;
    at least one optical unit for choosing one laser beam out of plural laser beams emitted from the plural lasers to divide a spot of the laser beam into two;
    at least one optical unit for widening spots of two divided laser beams on an irradiation object in the vertical direction of the sections of the spots of the divided laser beams to shape the laser beams into linear beams;
    at least one optical unit for shaping other plural laser beams into linear beams on the irradiation object; and
    at least one optical unit for synthesizing the plural linear laser beams into one linear laser light on the irradiation object,
    wherein, in the linear laser light obtained by synthesizing, its edges in the longitudinal direction of the laser light are the sections of the divided laser beams and the divided laser beams are distanced from each other on the irradiation object.

11. An apparatus according to claim 10, wherein attenuation regions in a longitudinal direction of the linear laser light obtained by synthesizing are each 200 µm or less.

12. An apparatus according to claim 10, wherein the linear laser light has a wavelength of 400 nm or higher.

13. An apparatus according to claim 10, wherein the spot of the laser beam is divided into equal parts.

14. An apparatus according to claim 10, wherein the lasers are continuous wave or pulse oscillation solid-state lasers or gas lasers or metal lasers.

15. An apparatus according to claim 10, wherein each of the lasers is selected from the group consisting of a continuous wave and pulse oscillation of YAG laser, $YVO_4$ laser, YLF laser, $YAlO_3$ laser, $Y_2O_3$ laser, glass laser, ruby laser, alexandrite laser, and Ti:sapphire laser.

16. An apparatus according to claim 10, wherein each of the lasers is selected from the group consisting of a continuous wave and pulse oscillation of excimer laser, Ar laser, Kr laser, and $CO_2$ laser.

17. An apparatus according to claim 10, wherein each of the lasers is selected from the group consisting of a continuous wave and pulse oscillation of helium cadmium laser, copper steam laser, and gold steam laser.

18. An apparatus according to claim 10, wherein the laser beams are converted into harmonic by a non-linear optical element.

19. A laser irradiation method comprising:
emitting a plurality of laser beams out of a plurality of lasers;
choosing one laser beam out of plural laser beams emitted from the plural lasers to divide a spot of the laser beam into two; and
synthesizing the other plural laser beams and two divided laser beams into a laser light on an irradiation object, wherein the divided laser beams are distanced from each other on the irradiation object.

20. A method according to claim 19, wherein the laser light obtained by synthesizing has a linear shape.

21. A method according to claim 19, wherein the spot of the laser beam is divided into equal parts.

22. A method according to claim 19, wherein an irradiation object is irradiated with the synthesized linear laser light while moving the irradiation object and the laser light relative to each other.

23. A method according to claim 19, wherein the lasers are selected from the group consisting of continuous wave lasers, pulse oscillation lasers, solid-state lasers, gas lasers, and metal lasers.

24. A method according to claim 19, wherein each of the lasers is selected from the group consisting of a continuous wave and pulse oscillation of YAG laser, $YVO_4$ laser, YLF laser, $YAlO_3$ laser, $Y_2O_3$ laser, glass laser, ruby laser, alexandrite laser, and Ti:sapphire laser.

25. A method according to claim 19, wherein each of the lasers is selected from the group consisting of Ar laser, Kr laser, and $CO_2$ laser.

26. A method according to claim 19, wherein each of the lasers is selected from the group consisting of a continuous wave and pulse oscillation of elium cadmium laser, copper steam laser, and gold steam laser.

27. A method according to claim 19, wherein the laser light is converted into harmonic by a non-linear optical element.

28. A method of manufacturing a semiconductor device, wherein a laser irradiation method according to claim 19 is used to heat a semiconductor film.

29. A method of manufacturing a semiconductor device, wherein a laser irradiation method according to claim 19 is used to crystallize a semiconductor film.

30. A method of manufacturing a semiconductor device, wherein a laser irradiation method according to claim 19 is used to heat a semiconductor film.

31. A method of manufacturing a semiconductor device, wherein a laser irradiation method according to claim 19 is used to crystallize a semiconductor film and to activate the crystallized semiconductor film.

32. A laser irradiation method comprising:
emitting a plurality of laser beams out of a plurality of lasers;
choosing one laser beam out of plural laser beams emitted from the plural lasers to divide a spot of the laser beam into two;
widening spots of divided laser beams on an irradiation object in the vertical direction of the sections of the spots of the divided laser beams to shape the laser beams into linear beams;
shaping other plural laser beams into linear beams on the irradiation object; and
synthesizing the plural linear laser beams into one linear laser light on the irradiation object,
wherein, in the linear laser light obtained by synthesizing, its edges in the longitudinal direction of the laser light are the sections of the divided laser beams and the divided laser beams are distanced from each other on the irradiation object.

33. A method according to claim 32, wherein attenuation regions in the longitudinal direction of the laser light obtained by synthesizing are each 200 µm or less.

34. A method according to claim 32, wherein the spot of the laser beam is divided into equal parts.

35. A method according to claim 32, wherein an irradiation object is irradiated with the synthesized linear laser light while moving the irradiation object and the laser light relative to each other.

36. A method according to claim 32, wherein the lasers are selected from the group consisting of continuous wave lasers, pulse oscillation lasers, solid-state lasers, gas lasers, and metal lasers.

37. A method according to claim 32, wherein each of the lasers is selected from the group consisting of a continuous wave and pulse oscillation of YAG laser, $YVO_4$ laser, YLF laser, $YAlO_3$ laser, $Y_2O_3$ laser, glass laser, ruby laser, alexandrite laser, and Ti:sapphire laser.

38. A method according to claim 32, wherein each of the lasers is selected from the group consisting of Ar laser, Kr laser, and $CO_2$ laser.

39. A method according to claim 32, wherein each of the lasers is selected from the group consisting of a continuous wave and pulse oscillation of elium cadmium laser, copper steam laser, and gold steam laser.

40. A method according to claim 32, wherein the laser light is converted into harmonic by a non-linear optical element.

41. A method of manufacturing a semiconductor device, wherein a laser irradiation method according to claim 32 is used to heat a semiconductor film.

42. A method of manufacturing a semiconductor device, wherein a laser irradiation method according to claim 32 is used to crystallize a semiconductor film.

43. A method of manufacturing a semiconductor device, wherein a laser irradiation method according to claim 32 is used to heat a semiconductor film.

44. A method of manufacturing a semiconductor device, wherein a laser irradiation method according to claim 32 is used to crystallize a semiconductor film and to activate the crystallized semiconductor film.

* * * * *